US008810325B2

(12) United States Patent
Aoyama et al.

(10) Patent No.: US 8,810,325 B2
(45) Date of Patent: *Aug. 19, 2014

(54) QUANTUM INTERFERENCE DEVICE, ATOMIC OSCILLATOR AND MAGNETIC SENSOR

(75) Inventors: Taku Aoyama, Setagaya (JP); Koji Chindo, Kawasaki (JP)

(73) Assignee: Seiko Epson Corporation (JP)

( * ) Notice: Subject to any disclaimer, the term of this patent is extended or adjusted under 35 U.S.C. 154(b) by 47 days.

This patent is subject to a terminal disclaimer.

(21) Appl. No.: 13/601,202

(22) Filed: Aug. 31, 2012

(65) Prior Publication Data

US 2012/0319785 A1 Dec. 20, 2012

Related U.S. Application Data

(63) Continuation of application No. 12/872,012, filed on Aug. 31, 2010, now Pat. No. 8,279,016.

(30) Foreign Application Priority Data

Sep. 7, 2009 (JP) .................................. 2009-205643

(51) Int. Cl.
*G04F 5/14* (2006.01)
*H03L 7/26* (2006.01)

(52) U.S. Cl.
CPC . *G04F 5/145* (2013.01); *H03L 7/26* (2013.01)
USPC ............................................. 331/94.1; 331/3

(58) Field of Classification Search
CPC ............. G04F 5/145; G04F 5/14; H03L 7/26; H01S 1/06
USPC .............. 331/94.1, 3; 372/26, 28, 20, 29.011, 372/38.01, 56
See application file for complete search history.

(56) References Cited

U.S. PATENT DOCUMENTS

| 6,201,821 | B1 * | 3/2001 | Zhu et al. .......................... 372/32 |
| 6,359,916 | B1 | 3/2002 | Zhu |
| 6,888,780 | B2 | 5/2005 | Happer et al. |
| 7,323,941 | B1 | 1/2008 | Happer et al. |
| 8,237,514 | B2 * | 8/2012 | Aoyama et al. ............... 331/94.1 |
| 8,279,016 | B2 * | 10/2012 | Aoyama et al. ............... 331/94.1 |
| 2006/0278819 | A1 | 12/2006 | Matsumoto |
| 2009/0256638 | A1 | 10/2009 | Rosenbluh et al. |
| 2009/0289728 | A1 | 11/2009 | Ben-Aroya et al. |

FOREIGN PATENT DOCUMENTS

| CN | 1881007 A | 12/2006 |
| JP | 2004-096410 | 3/2004 |
| WO | WO-00-43842 A2 | 7/2000 |

* cited by examiner

*Primary Examiner* — Ryan Johnson
(74) *Attorney, Agent, or Firm* — Harness, Dickey & Pierce, P.L.C.

(57) ABSTRACT

A quantum interference device causing electromagnetically induced transparency in an alkali metal atom includes: a light source generating first and second resonant lights with frequency differences $\Delta\omega$; a magnetic field generator applying a magnetic field to the atom; a light detector detecting intensities of the first and second resonant lights passing through the atom; and a controller causing a frequency difference between specified first and second resonant lights to equal a frequency difference corresponding to an energy difference between two ground levels of the atom based on the detected light. The controller causes the frequency $\Delta\omega$ or magnetic field intensity to satisfy $2\times\delta\times n=\Delta\omega$ or $\Delta\omega\times n=2\times\delta$. The frequency $\delta$ corresponds to an energy difference between two Zeeman split levels differentiated by one magnetic quantum number and generated in the two ground levels of the atom by energy splitting.

16 Claims, 15 Drawing Sheets

QUANTUM INTERFERENCE DEVICE, ATOMIC OSCILLATOR AND MAGNETIC SENSOR

CROSS-REFERENCE TO RELATED APPLICATIONS

This is a continuation application of U.S. Ser. No. 12/872,012 filed Aug. 31, 2010 which claims priority to Japanese Patent Application No. 2009-205643, filed Sep. 7, 2009 all of which are expressly incorporated by reference herein in their entireties.

BACKGROUND

1. Technical Field

The present invention relates to a quantum interference device, an atomic oscillator and a magnetic sensor.

2. Related Art

An atomic oscillator based on an electromagnetically induced transparency (EIT) system (also called a coherent population trapping (CPT) system) is an oscillator using a phenomenon (EIT phenomenon) in which when two resonant lights different from each other in wavelength (frequency) are simultaneously irradiated to an alkali metal atom, the absorption of the two resonant lights is stopped. It is known that the interaction mechanism between the alkali metal atom and the two resonant lights can be explained in a Λ-type 3-level system model. The alkali metal atom has two ground levels, and when resonant light 1 having a wavelength (frequency) corresponding to an energy difference between the ground level 1 and the excited level or resonant light 2 having a wavelength (frequency) corresponding to an energy difference between the ground level 2 and the excited level are individually irradiated to the alkali metal atom, light absorption occurs as is well known. However, when the resonant light 1 and the resonant light 2 in which the frequency difference accurately coincides with the frequency corresponding to the energy difference between the ground level 1 and the ground level 2 are simultaneously irradiated to the alkali metal atom, a superposition state of the two ground levels, that is, a quantum interference state occurs, the excitation to the excited level is stopped, and the transparency (EIT) phenomenon occurs in which the resonant light 1 and the resonant light 2 pass through the alkali metal atom. This phenomenon is used and an oscillator with high accuracy can be formed by detecting and controlling the abrupt change of light absorption behavior when the frequency difference between the resonant light 1 and the resonant light 2 shifts from the frequency corresponding to the energy difference between the ground level 1 and the ground level 2. Besides, since the energy difference between the ground level 1 and the ground level 2 is sensitively changed by the intensity or fluctuation of external magnetic field, a highly sensitive magnetic sensor can also be formed by using the EIT phenomenon.

In the atomic oscillator or the magnetic sensor, in order to improve the signal to noise ratio (S/N ratio) of the output signal, the number of alkali metal atoms that cause the EIT phenomenon has only to be increased. For example, JP-A-2004-96410 (patent document 1) discloses a method in which in order to improve the S/N ratio of an output signal of an atomic oscillator, the thickness of a cell in which gaseous alkali metal atoms are confined is increased, or the beam diameter of a laser beam incident on the cell is increased. In either method, in order to widen an area where the alkali metal atoms are irradiated with the resonant light, the thickness or the height of the cell is increased. Besides, U.S. Pat. No. 6,359,916 (patent document 2) proposes an atomic oscillator in which D1 line is used as a light source, so that the intensity of an EIT signal (signal of light passing through the alkali metal atom by the EIT phenomenon) is improved theoretically as compared with the related art case of D2 line, and the sensitivity and frequency stability accuracy is improved by this. In the atomic oscillator disclosed in the patent document 1 or the patent document 2, only one pair of two kinds of laser lights satisfying the occurring condition of the EIT phenomenon is used.

When attention is paid to individual atoms constituting a group of gaseous alkali metal atoms in the cell, they have a certain velocity distribution corresponding to the respective motion states. FIG. 15 is a schematic view of the velocity distribution of a gaseous alkali metal atom group confined in a container. The horizontal axis of FIG. 15 indicates the velocity of a gaseous alkali metal atom, and the vertical axis indicates the ratio of the number of gaseous alkali metal atoms having the velocity. As shown in FIG. 15, the gaseous alkali metal atoms have the certain velocity distribution corresponding to temperature, the center of which is the velocity of 0. Here, the velocity means an atom velocity component parallel to the irradiation direction when a laser beam is irradiated to the gaseous alkali metal atom group, and the value of the velocity of the atom at rest relative to a light source is 0. As stated above, when the velocity of the gaseous alkali metal atoms has the distribution, by the light Doppler effect (Doppler shift), the apparent wavelength (frequency) of the resonant light, that is, the wavelength (frequency) of the resonant light when viewed from the gaseous alkali metal atom has a distribution. This means that in atoms different in velocity, the excited levels are seemingly different. As shown in FIG. 16, the excited level has the broadening of certain width (Doppler broadening). Accordingly, even if a pair of the resonant light 1 and the resonant light 2 are simultaneously irradiated, only a very small part of the atoms having a specific velocity component value (for example, 0) with respect to the incident direction of the laser can actually cause the EIT phenomenon. A considerable number of gaseous alkali metal atoms which do not cause the EIT phenomenon and remain exist in the group, and the ratio of atoms contributing to the EIT phenomenon is very low. In order to increase the intensity of the EIT signal in the state where the EIT occurrence efficiency is low as described above, the thickness or the height of the cell must be increased as disclosed in the patent document 1, and there is a problem that miniaturization is difficult. Besides, in the state where the EIT occurrence efficiency is low, since the use efficiency of laser power is low, when the intensity of the EIT signal is kept at a certain level or higher, it is difficult to reduce the laser power, and there is a disadvantage also in power saving.

SUMMARY

An advantage of some aspects of the invention is to provide a quantum interference device in which the occurrence efficiency of an EIT phenomenon in alkali metal atoms is raised and the use efficiency of laser power can be improved, and to provide a small atomic oscillator or a magnetic sensor by using this.

According to an aspect of the invention, there is provided a quantum interference device that causes an electromagnetically induced transparency phenomenon to occur in an alkali metal atom by a resonant light pair including a first resonant light and a second resonant light. The quantum interference device includes a light source to generate a plurality of the first resonant lights different from each other in frequency by $\Delta\omega$ and a plurality of the second resonant lights different from each other in frequency by $\Delta\omega$, a magnetic field generation unit that applies a magnetic field to the alkali metal atom, a light detection unit that detects intensities of lights including the first resonant lights and the second resonant lights passing through the alkali metal atom, and a control unit that controls to cause a frequency difference between the specified first resonant light and the specified second resonant light to become equal to a frequency difference corresponding to an energy difference between two ground levels of the alkali metal atom based on a detection result of the light detection unit. The control unit controls at least one of the frequency $\Delta\omega$ and intensity of the magnetic field generated by the magnetic field generation unit to satisfy at least one of $2\times\delta\times n=\Delta\omega$ and $\Delta\omega\times n=2\times\delta$ (n is a positive integer) with respect to a frequency $\delta$ corresponding to an energy difference between two Zeeman split levels different from each other in magnetic quantum number by one among a plurality of Zeeman split levels generated in each of the two ground levels of the alkali metal atom by energy splitting due to the magnetic field.

According to the aspect of the invention, the plurality of first resonant lights 1 different from each other in frequency by $\Delta\omega$ and the plurality of second resonant lights 2 different from each other in frequency by $\Delta\omega$ are generated so that the frequency difference between the specified first resonant light and the specified second resonant light becomes equal to the frequency difference corresponding to the energy difference between the two ground levels of the alkali metal atom. Accordingly, when the frequency of the first resonant light is $f_1$, the frequency of the second resonant light is $f_2$, and the frequency corresponding to the energy difference between the two ground levels of the alkali metal atom is $f_E$, with respect to the resonant light 1 of $f_1=\omega_1$ and the resonant light 2 of $f_2=\omega_2$, when the relation of $f_1-f_2=f_E$ is satisfied, the relation of $f_1-f_2=f_E$ is satisfied also for resonant light 1 of $f_1=\omega_1+k\times\Delta\omega$ and the resonant light 2 of $f_2=\omega_2+k\times\Delta\omega$ (k is a positive integer), and the relation of $f_1-f_2=f_E$ is satisfied also for the resonant light 1 of $f_1=\omega_1-k\times\Delta\omega$ and the resonant light 2 of $f_2=\omega_2-k\times\Delta\omega$ (k is a positive integer). Thus, an alkali metal atom whose velocity is not 0 can also cause the EIT phenomenon, and the ratio of the number of the alkali metal atoms that cause the EIT phenomenon can be increased as compared with the related art.

Further, according to the aspect of the invention, the control is performed so that at least one of $2\times\delta\times n=\Delta\omega$ and $\Delta\omega\times n=2\times\delta$ (n is a positive integer) is satisfied. Thus, the alkali metal atom in which the magnetic quantum number is not 0 can also cause the EIT phenomenon, and the ratio of the number of alkali metal atoms that cause the EIT phenomenon can be greatly increased as compared with the related art.

Accordingly, according to this aspect of the invention, the quantum interference device can be provided in which the occurrence efficiency of the EIT phenomenon in the alkali metal atoms is raised, and the use efficiency of the laser power can be improved.

The quantum interference device of the aspect of the invention may be configured such that the control unit controls the frequency $\Delta\omega$ based on the detection result of the light detection unit.

For example, the control unit may feedback control the frequency $\Delta\omega$ so that the detection result of the light detection unit becomes maximum.

The quantum interference device of the aspect of the invention may be configured such that the control unit controls the frequency $\Delta\omega$ based on the intensity of the magnetic field near the alkali metal atom.

For example, the control unit includes a magnetic field detection unit that detects the intensity of the magnetic field near the alkali metal atom, and may control the frequency $\Delta\omega$ based on the detection result of the magnetic field detection unit.

Besides, for example, the control unit may include a magnetic field control unit that controls so that the magnetic field generation unit generates the magnetic field of a previously determined intensity, and may control the frequency $\Delta\omega$ according to the magnetic field of the previously determined intensity.

The quantum interference device of the aspect of the invention may be configured such that the control unit includes a magnetic field control unit that controls the intensity of the magnetic field generated by the magnetic field generation unit according to the previously determined frequency $\Delta\omega$.

The quantum interference device of the aspect of the invention may be configured such that $n=1$ is established. That is, the control unit may control to satisfy a relation of $\Delta\omega=2\delta$.

With this configuration, since the occurrence efficiency of the EIT phenomenon in the alkali metal atoms can be raised to the maximum, the use efficiency of the laser power can be extracted to the utmost.

According to another aspect of the invention, there is provided an atomic oscillator including the quantum interference device.

According to still another aspect of the invention, there is provided a magnetic sensor including the quantum interference device.

DESCRIPTION OF EXEMPLARY EMBODIMENTS

Hereinafter, embodiments of the invention will be described in detail with reference to the drawings. Incidentally, the embodiments described below do not improperly limit the content of the invention recited in the claims. Besides, all components described below are not necessarily inevitable components of the invention.

1. Quantum Interference Device

Figure 1:
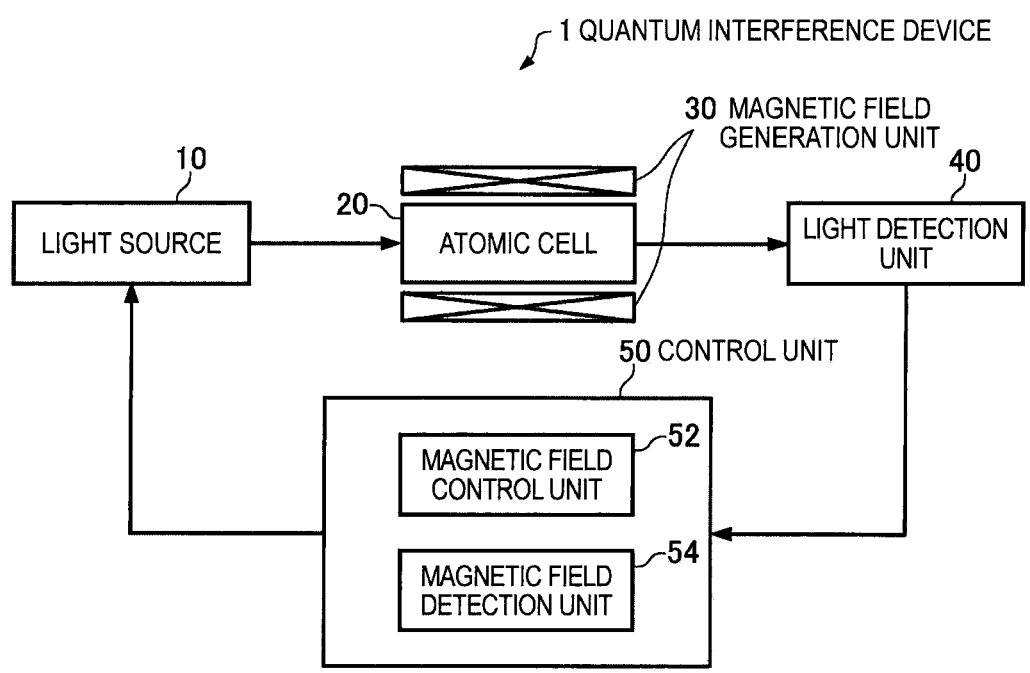
FIG. 1 is a functional block diagram of a quantum interference device of an embodiment.

FIG. 1 is a functional block diagram of a quantum interference device of an embodiment.

The quantum interference device 1 of the embodiment includes a light source 10, an atomic cell 20, a magnetic field generation unit 30, a light detection unit 40 and a control unit 50.

The light source 10 generates plural first resonant lights (resonant light 1) different from each other in frequency by $\Delta\omega$, and plural second resonant lights (resonant light 2) different from each other in frequency by $\Delta\omega$.

The atomic cell 20 contains gaseous alkali metal atoms, and the magnetic field generation unit 30 applies a magnetic field to the alkali metal atoms.

The light detection unit 40 detects intensities of lights passing through the alkali metal atom and including the resonant light 1 and the resonant light 2.

Based on the detection result of the light detection unit 40, the control unit 50 controls so that a frequency difference between a specified first resonant light and a specified second resonant light is equal to a frequency difference corresponding to an energy difference between two ground levels of the alkali metal atom. Further, the control unit 50 controls at least one of the frequency $\Delta\omega$ and the intensity of the magnetic field generated by the magnetic field generation unit so that at least one of $2\times\delta\times n=\Delta\omega$ and $\Delta\omega\times n=2\times\delta$ (n is a positive integer) is satisfied with respect to a frequency $\delta$ corresponding to an energy difference between two Zeeman split levels different from each other in magnetic quantum number by one among plural Zeeman split levels generated in each of the two ground levels of the alkali metal atom by energy splitting due to the magnetic field. In order to maximize the intensity of the EIT signal, it is preferable that the control unit 50 controls to satisfy the relation of n=1, that is, $\Delta\omega=2\delta$.

Besides, the control unit 50 may include a magnetic field control unit 52 that controls the intensity of the magnetic field generated by the magnetic field generation unit 30 according to the previously determined frequency $\Delta\omega$.

Besides, the control unit 50 may control the frequency $\Delta\omega$ based on the detection result of the light detection unit 40. For example, the control unit 50 may feedback control the frequency $\Delta\omega$ so that the detection result of the light detection unit 40 becomes maximum.

Besides, the control unit 50 may control the frequency $\Delta\omega$ based on the intensity of the magnetic field near the alkali metal atom. For example, the control unit 50 includes a magnetic field detection unit 54 that detects the intensity of the magnetic field near the alkali metal atom, and may control the frequency $\Delta\omega$ based on the detection result of the magnetic field detection unit 54. Besides, for example, the control unit 50 controls so that the magnetic field generation unit 30 generates a magnetic field of a previously determined intensity by the magnetic field control unit 52, and may control the frequency $\Delta\omega$ according to the previously determined intensity of the magnetic field.

Hereinafter, a more specific structure will be described while an atomic oscillator and a magnetic sensor, which use the quantum interference device of the embodiment, are used as examples.

2. Atomic Oscillator

(1) First Embodiment

Figure 2:
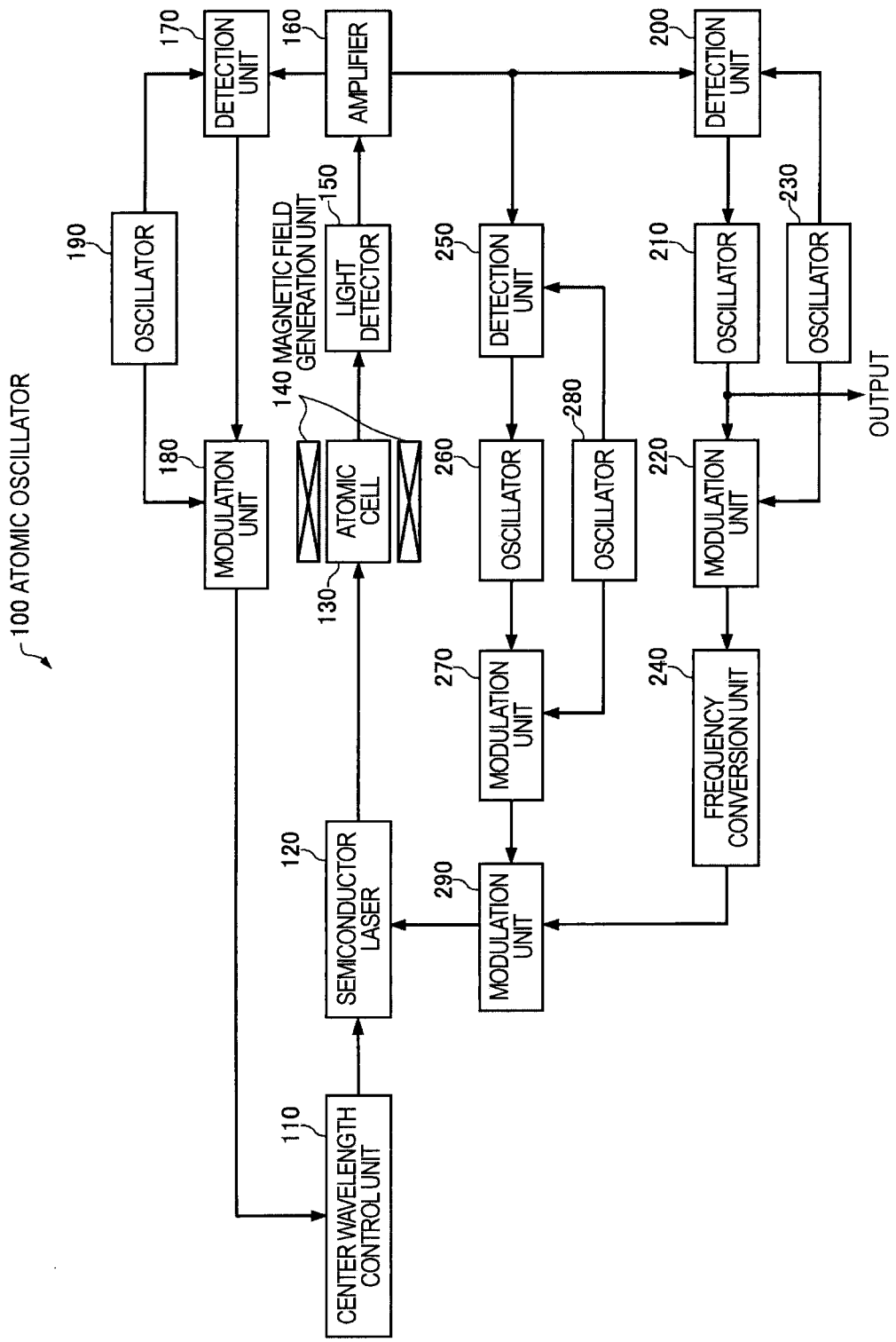
FIG. 2 is a view showing a structure of an atomic oscillator of a first embodiment.

FIG. 2 is a view showing a structure of an atomic oscillator of a first embodiment using the quantum interference device of FIG. 1.

As shown in FIG. 2, the atomic oscillator 100 of the first embodiment includes a center wavelength control unit 110, a semiconductor laser 120, an atomic cell 130, a magnetic field generation unit 140, a light detector 150, an amplifier 160, a detection unit 170, a modulation unit 180, an oscillator 190, a detection unit 200, an oscillator 210, a modulation unit 220, an oscillator 230, a frequency conversion unit 240, a detection unit 250, an oscillator 260, a modulation unit 270, an oscillator 280 and a modulation unit 290.

Figure 3:
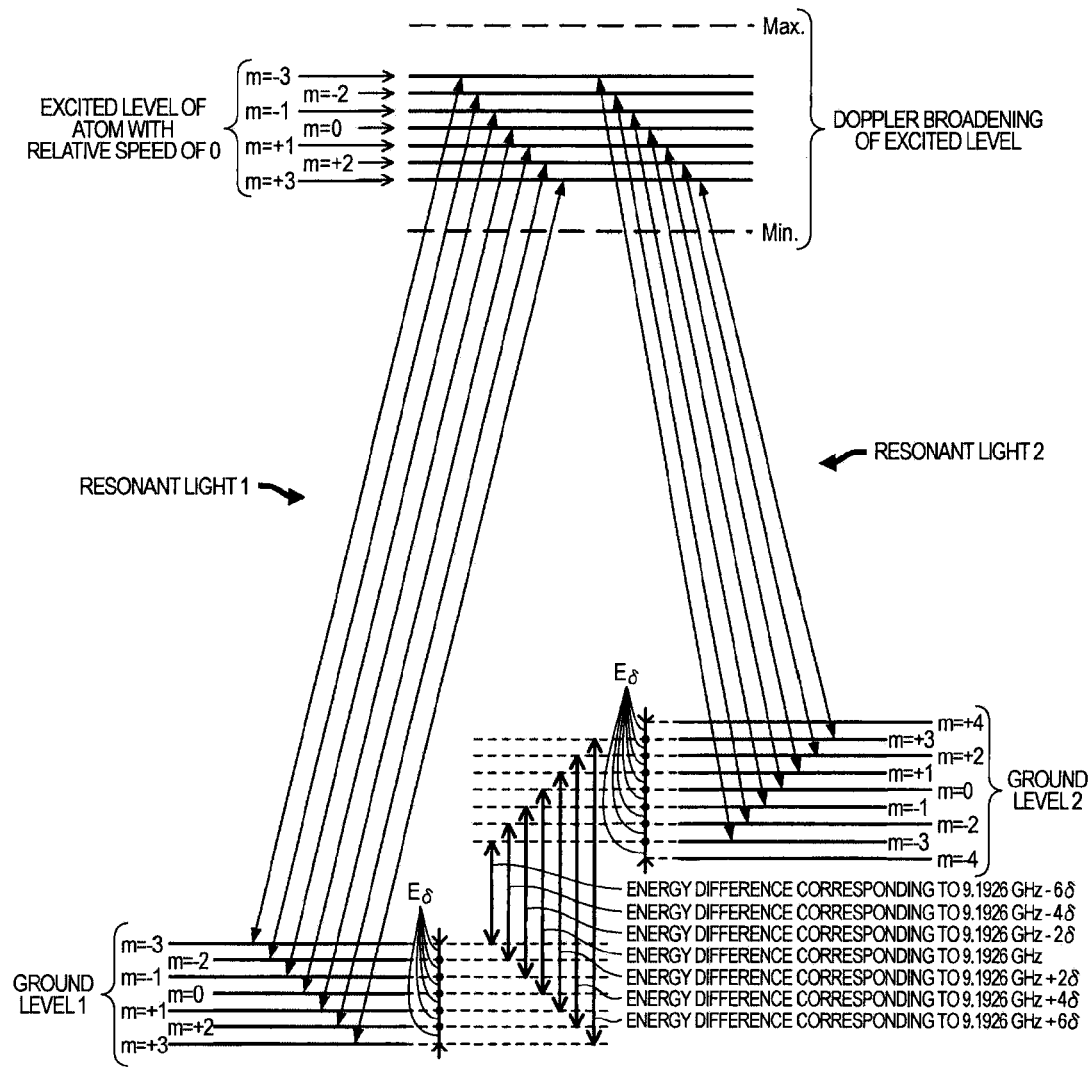
FIG. 3 is a view for explaining a relation between a Zeeman split ground level of a cesium atom and a resonant light.

The atomic cell 130 is such that gaseous alkali metal atoms (sodium (Na) atoms, rubidium (Rb) atoms, cesium (Cs) atom, etc.) are enclosed in a container. In this embodiment, a magnetic field is applied to the atomic cell 130 by the magnetic field generation unit 140 (for example, a coil). Thus, each of two ground levels of the alkali metal atom is divided into plural levels (Zeeman split levels) different from each other in magnetic quantum number m by energy splitting (Zeeman splitting) due to the magnetic field. Here, it is known that the number of Zeeman split levels varies according to the kind of the alkali metal atom. For example, in the case of the cesium atom, as shown in FIG. 3, the ground level 1 is divided into seven Zeeman split levels with magnetic quantum number m=−3, −2, −1, 0, +1, +2, +3 in descending order of energy. On the other hand, the ground level 2 is divided into nine Zeeman split levels with magnetic quantum number m=+4, +3, +2, +1, 0, −1, −2, −3, −4 in descending order of energy. Here, in both the ground level 1 and the ground level 2, an energy difference $E_\delta$ between two Zeeman split levels different from each other in magnetic quantum number m by one is equal. The energy difference $E_\delta$ is changed according to the intensity of the magnetic field. That is, as the intensity of the magnetic field becomes large, the energy difference $E_\delta$ becomes large. Incidentally, in the following description, a frequency corresponding to the $E_\delta$ is $\delta$.

When a resonant light pair (resonant light 1, resonant light 2) having a frequency difference corresponding to an energy difference between two ground levels of the alkali metal atom are simultaneously irradiated to the atomic cell 130, the alkali metal atom causes the EIT phenomenon. Incidentally, in the following description, the frequencies of the resonant light 1 and the resonant light 2 are respectively denoted by $f_1$ and $f_2$.

FIG. 3 shows an example showing a case where the Λ-type 3-level system is established when the magnetic quantum number of the ground level 1 and that of the ground level 2 are equal to each other (common m). In the cesium atom with magnetic quantum number m=0, since the frequency corresponding to the energy difference between the ground level 1 and the ground level 2 is 9.1926 GHz, when the resonant light 1 and the resonant light 2 satisfying the relation of $f_1-f_2=9.1926$ GHz are simultaneously irradiated, the EIT phenomenon occurs. Besides, in the cesium atom with magnetic quantum number m=+1, since the frequency corresponding to the energy difference between the ground level 1 and the ground level 2 is 9.1926 GHz+2δ, when the resonant light 1 and the resonant light 2 satisfying the relation of $f_1-f_2$=9.1926 GHz+2δ are simultaneously irradiated, the EIT phenomenon occurs. Besides, in the cesium atom with magnetic quantum number m=−1, since the frequency corresponding to the energy difference between the ground level 1 and the ground level 2 is 9.1926 GHz−2δ, when the resonant light 1 and the resonant light 2 satisfying the relation of $f_1-f_2$=9.1926 GHz−2δ are simultaneously irradiated, the EIT phenomenon occurs. Similarly, in the respective cesium atoms with magnetic quantum numbers m=+2, +3, −2, −3, when the resonant light 1 and the resonant light 2 satisfying the relation of $f_1-f_2$=9.1926 GHz+4δ, $f_1-f_2$=9.1926 GHz+6δ, $f_1-f_2$=9.1926 GHz−4δ, $f_1-f_2$=9.1926 GHz−6δ are respectively simultaneously irradiated, the EIT phenomenon occurs. Incidentally, the cesium atom with magnetic quantum number m=+4 or −4, since the ground level 1 does not exist, the EIT phenomenon does not occur.

In this embodiment, the semiconductor laser 120 emits the laser light including plural resonant light pairs and irradiates them to the alkali metal atoms so that the alkali metal atoms enclosed in the atomic cell 130 efficiently cause the EIT phenomenon. Specifically, with respect to the laser light emitted by the semiconductor laser 120, its center wavelength $\lambda_0$ is controlled based on the output of the center wavelength control unit 110, and modulation is applied based on the output of the modulation unit 290. For example, when a laser driver to supply a drive current to the semiconductor laser 120 is used as the center wavelength control unit 110, an AC current outputted by the modulation unit 290 is superimposed on the drive current, so that the laser light emitted by the semiconductor laser 120 can be modulated. In this embodiment, as described later, the output of the modulation unit 290 is feedback controlled so that the light corresponding to the modulation component becomes the resonant light 1 or the resonant light 2 to the alkali metal atom.

Incidentally, the semiconductor laser 120 may be an edge emitting laser, or a surface emitting laser such as a vertical cavity surface emitting laser (VCSEL).

The light detector 150 detects the light passing through the atomic cell 130, and outputs the signal having the signal intensity corresponding to the amount of the detected light. The output signal of the light detector 150 is amplified by the amplifier 160, and is inputted to the detection unit 170, the detection unit 200 and the detection unit 250.

The detection unit 170 synchronously detects the output signal of the amplifier 160 by the oscillation signal of the oscillator 190. The modulation unit 180 modulates the output signal of the detection unit 170 by the oscillation signal of the oscillator 190. The oscillator 190 is oscillated at a low frequency of, for example, several tens Hz to several hundreds Hz. The center wavelength control unit 110 controls the center wavelength $\lambda_0$ of the laser light emitted by the semiconductor laser 120 according to the output signal of the modulation unit 180. The center wavelength $\lambda_0$ is stabilized by a feedback loop passing through the semiconductor laser 120, the atomic cell 130, the light detector 150, the amplifier 160, the detection unit 170, the modulation unit 180 and the center wavelength control unit 110.

The detection unit 200 synchronously detects the output signal of the amplifier 160 by the oscillation signal of the oscillator 230. The oscillator 210 is the oscillator in which the oscillation frequency is changed according to the magnitude of the output signal of the detection unit 200, and can be realized by, for example, a voltage controlled crystal oscillator (VCXO). Here, the oscillator 210 oscillates at, for example, about 10 MHz, and the oscillation signal becomes the output signal of the atomic oscillator 100. The modulation unit 220 modulates the output signal of the oscillator 210 by the oscillation signal of the oscillator 230. The oscillator 230 is oscillated at a low frequency of, for example, several tens Hz to several hundreds Hz.

The frequency conversion unit 240 converts the output signal of the modulation unit 220 into a signal of a frequency equal to ½ (in the case of the cesium atom, 9.1926 GHz/2=4.5963 GHz) of a frequency difference corresponding to an energy difference between the two ground levels of the alkali metal atom with magnetic quantum number m=0 enclosed in the atomic cell 130. The frequency conversion unit 240 can be realized by, for example, a phase locked loop (PLL) circuit. Incidentally, as described later, the frequency conversion unit 240 may convert the output signal of the modulation unit 220 into a signal of a frequency equal to the frequency difference (9.1926 GHz in the case of the cesium atom) corresponding to the energy difference between the two ground levels of the alkali metal atom with magnetic quantum number m=0 enclosed in the atomic cell 130.

The detection unit 250 synchronously detects the output signal of the amplifier 160 by the oscillation signal of the oscillator 280. The oscillator 260 is the oscillator in which the oscillation frequency is changed according to the magnitude of the output signal of the detection unit 250, and can be realized by, for example, a voltage controlled crystal oscillator (VCXO). Here, the oscillator 260 oscillates at a frequency Δω (for example, about 1 MHz to 10 MHz) sufficiently smaller than a frequency corresponding to the width of Doppler broadening of the excited level of the alkali metal atom enclosed in the atomic cell 130. The modulation unit 270 modulates the output signal of the oscillator 260 by the oscillation signal of the oscillator 280. The oscillator 280 is oscillated at a low frequency of, for example, several tens Hz to several hundreds Hz.

The modulation unit 290 modulates the output signal of the frequency modulation unit 240 by the output signal of the modulation unit 270 (the output signal of the modulation unit 270 may be modulated by the output signal of the frequency conversion unit 240). The modulation unit 290 can be realized by a frequency mixing unit (mixer), a frequency modulation (FM) circuit, an amplitude modulation (AM) circuit or the like. As described before, the laser light emitted by the semiconductor laser 120 is modulated based on the output of the modulation unit 290, and the plural resonant lights 1 and the plural resonant lights 2 are generated.

In the atomic oscillator having the structure as described above, unless the frequency difference between the resonant light 1 and the resonant light 2 emitted by the semiconductor laser 120 accurately coincides with the frequency corresponding to the energy difference between the two ground levels of the alkali metal atom, the alkali metal atom does not cause the EIT phenomenon. Thus, the detection amount of the light detector 150 changes very sensitively in response to the frequency of the resonant light 1 and that of the resonant light 2. Thus, by a feedback loop passing through the semiconductor laser 120, the atomic cell 130, the light detector 150, the amplifier 160, the detection unit 200, the oscillator 210, the modulation unit 220, the frequency conversion unit 240 and the modulation unit 290, the feedback control is performed so that the frequency of the output signal of the frequency conversion unit 240 very accurately coincides with the frequency equal to ½ of the frequency difference corresponding to the energy difference between the two ground levels of the alkali metal atom with magnetic quantum number m=0. As a result, the oscillator 210 existing in this feedback loop also oscillates at a very stable oscillation frequency, and the frequency accuracy of the output signal of the atomic oscillator 100 can be made very high.

However, even if the frequency of the output signal of the frequency conversion unit 240 very accurately coincides with the frequency equal to ½ of the frequency difference corresponding to the energy difference between the two ground levels of the alkali metal atom with magnetic quantum number m=0, as described later, unless at least the relation of $2 \times \delta \times n = \Delta\omega$ or $\Delta\omega \times n = 2 \times \delta$ (n=1 is desirable) is satisfied, the ratio of the alkali metal atoms that cause the EIT phenomenon becomes very low. As a result, the signal intensity of the EIT signal also becomes low. Then, in the atomic oscillator 100 of the embodiment, by the feedback loop passing through the semiconductor laser 120, the atomic cell 130, the light detector 150, the amplifier 160, the detection unit 250, the oscillator 260, the modulation unit 270 and the modulation unit 290, the feedback control is performed so that the oscillation frequency $\Delta\omega$ of the oscillator 260 satisfies the relation of $2 \times \delta \times n = \Delta\omega$ or $\Delta\omega \times n = 2 \times \delta$ (n=1 is desirable).

The semiconductor laser 120, the atomic cell 130, the magnetic field generation unit 140 and the light detector 150 correspond to the light source 10, the atomic cell 20, the magnetic field generation unit 30 and the light detection unit 40 of FIG. 1, respectively. Besides, a circuit including the center wavelength control unit 110, the amplifier 160, the detection unit 170, the modulation unit 180, the oscillator 190, the detection unit 200, the oscillator 210, the modulation unit 220, the oscillator 230, the frequency conversion unit 240, the detection unit 250, the oscillator 260, the modulation unit 270, the oscillator 280 and the modulation unit 290 corresponds to the control unit 50 of FIG. 1.

Figure 4A:
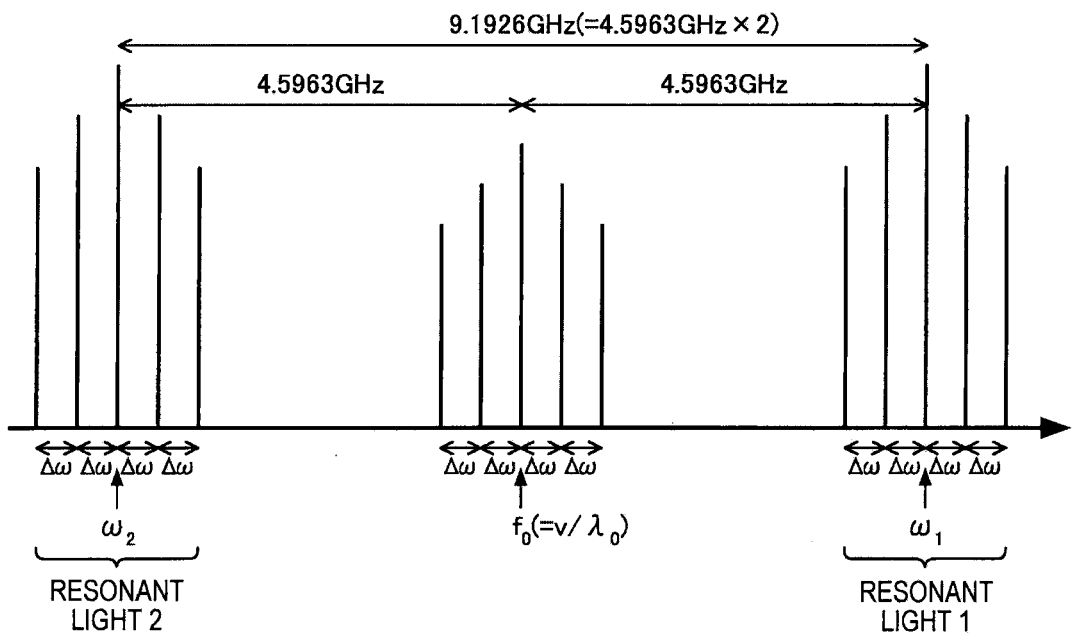
FIGS. 4A and 4B are views showing examples of a frequency spectrum of laser light emitted by a semiconductor laser in the embodiment.
Figure 4B:
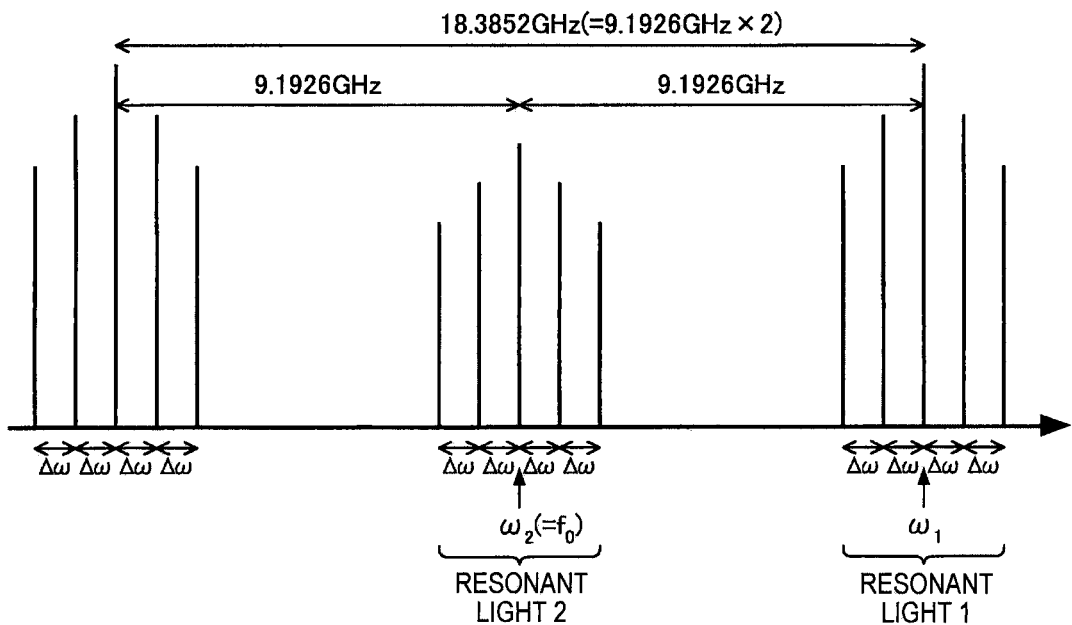

Next, the frequency of the laser light emitted by the semiconductor laser 120 will be described in detail. FIG. 4A and FIG. 4B are views showing examples of a frequency spectrum of the laser light emitted by the semiconductor laser 120.

As shown in FIG. 4A and FIG. 4B, the laser light emitted by the semiconductor laser 120 is modulated, and has a center frequency band having a center frequency $f_0$ ($=v/\lambda_0$: v is the velocity of light) and side bands on both sides of the center frequency band. Each of the center frequency band, the upper side band and the lower side band includes plural frequency components different from each other by $\Delta\omega$. Incidentally, in FIG. 4A and FIG. 4B, for convenience, it is assumed that each of the center frequency band, the upper side band and the lower side band includes five frequency components (center frequency component, primary and secondary higher harmonic wave components on both sides thereof). However, the third or more higher harmonic wave components are actually included.

In the example of FIG. 4A, both the frequency difference between the center of the upper side band and the center of the center frequency band and the frequency difference between the center of the center frequency band and the center of the lower side band are 4.5963 GHz. Thus, the frequency difference ($\omega_1 - \omega_2$) between the center ($\omega_1$) of the upper side band and the center ($\omega_2$) of the lower side band coincides with 9.1926 GHz as the frequency difference corresponding to the energy difference between the two ground levels of the cesium atom with magnetic quantum number m=0. Accordingly, when the center frequency $f_0$ (the center wavelength $\lambda_0$) of the laser light is set to a desired value, each of the frequency components included in the upper side band becomes the resonant light 1, and each of the frequency components included in the lower side band becomes the resonant light 2.

On the other hand, in the example of FIG. 4B, the frequency difference ($\omega_1 - \omega_2$) between the center ($\omega_1$) of the upper side band and the center ($\omega_2 = f_0$) of the center frequency band coincides with 9.1926 GHz as the frequency difference corresponding to the energy difference between the two ground levels of the cesium atom with magnetic quantum number m=0. Accordingly, when the center frequency $f_0$ (the center wavelength $\lambda_0$) of the laser light is set to a desired value, each of the frequency components included in the upper side band becomes the resonant light 1, and each of the frequency components included in the center frequency band becomes the resonant light 2. Incidentally, since the frequency difference between the center of the center frequency band and the center of the lower side band is also 9.1926 GHz, the center frequency $f_0$ (center wavelength $\lambda_0$) may be set so that each of the frequency components included in the center frequency band becomes the resonant light 1, and each of the frequency components included in the lower side band becomes the resonant light 2.

Incidentally, the feedback control is performed so that the frequency of the output signal of the frequency conversion unit 240 becomes $(\omega_1 - \omega_2)/2 = 4.5963$ GHz in the example of FIG. 4A, and becomes $(\omega_1 - \omega_2)/2 = 9.1926$ GHz in the example of FIG. 4B.

Figure 5:
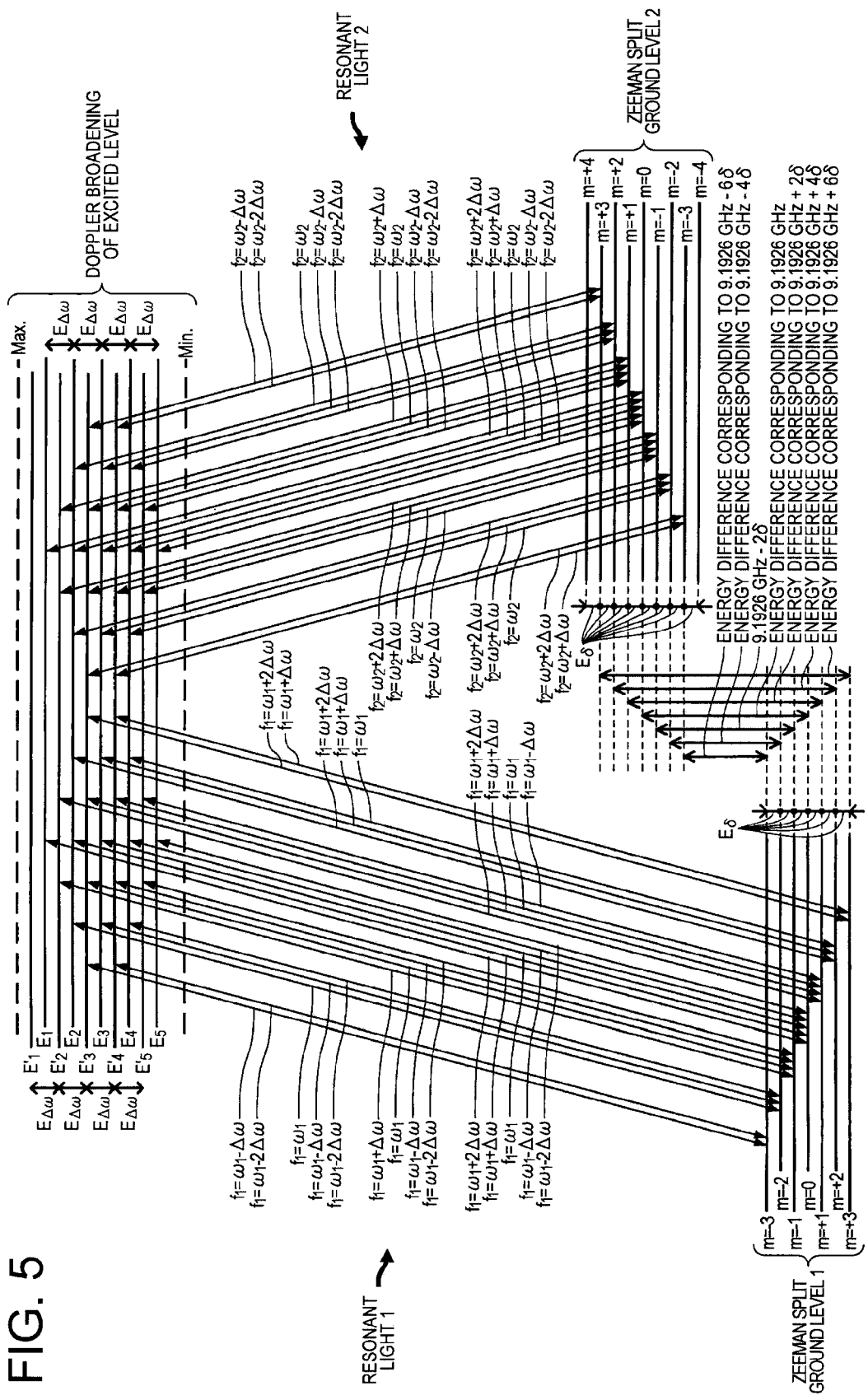
FIG. 5 is a view for explaining an example of a combination of two resonant lights in which the cesium atom causes an EIT phenomenon.

FIG. 5 is a view for explaining a combination of the resonant light 1 and the resonant light 2 in which the cesium atom whose ground level is Zeeman split causes the EIT phenomenon. In FIG. 5, it is assumed that the relation of $\Delta\omega = 2\delta$ is satisfied. Besides, each energy difference $E_{\Delta\omega}$ of excited levels $E_1, E_2, E_3, E_4$ and $E_5$ or excited levels $E_1', E_2', E_3', E_4'$ and $E_5'$ represents the energy difference corresponding to $\Delta\omega$.

First, the cesium atom with magnetic quantum number m=0 will be considered. In the cesium atom with magnetic quantum number m=0, since the frequency corresponding to the energy difference between the ground level 1 and the ground level 2 is 9.1926 GHz, the EIT phenomenon occurs when the resonant light 1 and the resonant light 2 satisfying the relation of $f_1 - f_2 = 9.1926$ GHz are simultaneously irradiated. Accordingly, in the cesium atom with apparent excited level $E_1$, the EIT phenomenon occurs when the resonant light 1 of $f_1 = \omega_1 + 2\Delta\omega$ and the resonant light 2 of $f_2 = \omega_2 + 2\Delta\omega$ are simultaneously irradiated. Besides, in the cesium atom with apparent excited level $E_2$, the EIT phenomenon occurs when the resonant light 1 of $f_1 = \omega_1 + \Delta\omega$ and the resonant light 2 of $f_2 = \omega_2 + \Delta\omega$ are simultaneously irradiated. Besides, the cesium atom with apparent excited level $E_3$, the EIT phenomenon occurs when the resonant light 1 of $f_1 = \omega_1$ and the resonant light 2 of $f_2 = \omega_2$ are simultaneously irradiated. Besides, the cesium atom with apparent excited level $E_4$, the EIT phenomenon occurs when the resonant light 1 of $f_1 = \omega_1 - \Delta\omega$ and the resonant light 2 of $f_2 = \omega_2 - \Delta\omega$ are simultaneously irradiated. Besides, the cesium atom with apparent excited level $E_5$, the EIT phenomenon occurs when the resonant light 1 of $f_1 = \omega_1 - 2\Delta\omega$ and the resonant light 2 of $f_2 = \omega_2 - 2\Delta\omega$ are simultaneously irradiated.

Next, the cesium atom with magnetic quantum number m=+1 will be considered. In the cesium atom with magnetic quantum number m=+1, since the frequency corresponding to the energy difference between the ground level 1 and the ground level 2 is 9.1926 GHz+2δ, the EIT phenomenon occurs when the resonant light 1 and the resonant light 2 satisfying the relation of $f_1 - f_2 = 9.1926$ GHz+2δ=9.1926 GHz+$\Delta\omega$ are simultaneously irradiated. Accordingly, in the cesium atom with apparent excited level $E_2'$, the EIT phenomenon occurs when the resonant light 1 of $f_1 = \omega_1 + 2\Delta\omega$ and the resonant light 2 of $f_2 = \omega_2 + \Delta\omega$ are simultaneously irradiated. Besides, in the cesium atom with apparent excited level $E_3'$, the EIT phenomenon occurs when the resonant light 1 of $f_1 = \omega_1 + \Delta\omega$ and the resonant light 2 of $f_2 = \omega_2$ are simultaneously irradiated. Besides, the cesium atom with apparent excited level $E_4'$, the EIT phenomenon occurs when the resonant light 1 of $f_1=\omega_1$ and the resonant light 2 of $f_2=\omega_2-\Delta\omega$ are simultaneously irradiated. Besides, the cesium atom with apparent excited level $E_5'$, the EIT phenomenon occurs when the resonant light 1 of $f_1=\omega_1-\Delta\omega$ and the resonant light 2 of $f_2=\omega_2-2\Delta\omega$ are simultaneously irradiated.

Next, the cesium atom with magnetic quantum number m=+2 will be considered. In the cesium atom with magnetic quantum number m=+2, since the frequency corresponding to the energy difference between the ground level 1 and the ground level 2 is 9.1926 GHz+4δ, the EIT phenomenon occurs when the resonant light 1 and the resonant light 2 satisfying the relation of $f_1-f_2$=9.1926 GHz+4δ=9.1926 GHz+2Δω are simultaneously irradiated. Accordingly, in the cesium atom with apparent excited level $E_2$, the EIT phenomenon occurs when the resonant light 1 of $f_1=\omega_1+2\Delta\omega$ and the resonant light 2 of $f_2=\omega_2$ are simultaneously irradiated. Besides, in the cesium atom with apparent excited level $E_3$, the EIT phenomenon occurs when the resonant light 1 of $f_1=\omega_1+\Delta\omega$ and the resonant light 2 of $f_2=\omega_2-\Delta\omega$ are simultaneously irradiated. Besides, the cesium atom with apparent excited level $E_4$, the EIT phenomenon occurs when the resonant light 1 of $f_1=\omega_1$ and the resonant light 2 of $f_2=\omega_2-2\Delta\omega$ are simultaneously irradiated.

Next, the cesium atom with magnetic quantum number m=+3 will be considered. In the cesium atom with magnetic quantum number m=+3, since the frequency corresponding to the energy difference between the ground level 1 and the ground level 2 is 9.1926 GHz+6δ, the EIT phenomenon occurs when the resonant light 1 and the resonant light 2 satisfying the relation of $f_1-f_2$=9.1926 GHz+6δ=9.1926 GHz+3Δω are simultaneously irradiated. Accordingly, in the cesium atom with apparent excited level $E_3'$, the EIT phenomenon occurs when the resonant light 1 of $f_1=\omega_1+2\Delta\omega$ and the resonant light 2 of $f_2=\omega_2-\Delta\omega$ are simultaneously irradiated. Besides, in the cesium atom with apparent excited level $E_4'$, the EIT phenomenon occurs when the resonant light 1 of $f_1=\omega_1+\Delta\omega$ and the resonant light 2 of $f_2=\omega_2-2\Delta\omega$ are simultaneously irradiated.

Next, the cesium atom with magnetic quantum number m=−1 will be considered. In the cesium atom with magnetic quantum number m=−1, since the frequency corresponding to the energy difference between the ground level 1 and the ground level 2 is 9.1926 GHz−2δ, the EIT phenomenon occurs when the resonant light 1 and the resonant light 2 satisfying the relation of $f_1-f_2$=9.1926 GHz−2δ=9.1926 GHz−Δω are simultaneously irradiated. Accordingly, in the cesium atom with apparent excited level $E_2'$, the EIT phenomenon occurs when the resonant light 1 of $f_1=\omega_1+\Delta\omega$ and the resonant light 2 of $f_2=\omega_2+2\Delta\omega$ are simultaneously irradiated. Besides, in the cesium atom with apparent excited level $E_3'$, the EIT phenomenon occurs when the resonant light 1 of $f_1=\omega_1$ and the resonant light 2 of $f_2=\omega_2+\Delta\omega$ are simultaneously irradiated. Besides, in the cesium atom with apparent excited level $E_4'$, the EIT phenomenon occurs when the resonant light 1 of $f_1=\omega_1-\Delta\omega$ and the resonant light 2 of $f_2=\omega_2$ are simultaneously irradiated. Besides, the cesium atom with apparent excited level $E_5'$, the EIT phenomenon occurs when the resonant light 1 of $f_1=\omega_1-2\Delta\omega$ and the resonant light 2 of $f_2=\omega_2-\Delta\omega$ are simultaneously irradiated.

Next, the cesium atom with magnetic quantum number m=−2 will be considered. In the cesium atom with magnetic quantum number m=−2, since the frequency corresponding to the energy difference between the ground level 1 and the ground level 2 is 9.1926 GHz−4δ, the EIT phenomenon occurs when the resonant light 1 and the resonant light 2 satisfying the relation of $f_1-f_2$=9.1926 GHz−4δ=9.1926 GHz−2Δω are simultaneously irradiated. Accordingly, in the cesium atom with apparent excited level $E_2$, the EIT phenomenon occurs when the resonant light 1 of $f_1=\omega_2$ and the resonant light 2 of $f_2=\omega_2+2\Delta\omega$ are simultaneously irradiated. Besides, in the cesium atom with apparent excited level $E_3$, the EIT phenomenon occurs when the resonant light 1 of $f_1=\omega_1-\Delta\omega$ and the resonant light 2 of $f_2=\omega_2+\Delta\omega$ are simultaneously irradiated. Besides, in the cesium atom with excited level $E_4$, the EIT phenomenon occurs when the resonant light 1 of $f_1=\omega_1-2\Delta\omega$ and the resonant light 2 of $f_2=\omega_2$ are simultaneously irradiated.

Next, the cesium atom with magnetic quantum number m=−3 will be considered. In the cesium atom with magnetic quantum number m=−3, since the frequency corresponding to the energy difference between the ground level 1 and the ground level 2 is 9.1926 GHz−6δ, the EIT phenomenon occurs when the resonant light 1 and the resonant light 2 satisfying the relation of $f_1-f_2$=9.1926 GHz−6δ=9.1926 GHz−3Δω are simultaneously irradiated. Accordingly, in the cesium atom with apparent excited level $E_3'$, the EIT phenomenon occurs when the resonant light 1 of $f_1=\omega_1-\Delta\omega$ and the resonant light 2 of $f_2=\omega_2+2\Delta\omega$ are simultaneously irradiated. Besides, in the cesium atom with apparent excited level $E_4'$, the EIT phenomenon occurs when the resonant light 1 of $f_1=\omega_1-2\Delta\omega$ and the resonant light 2 of $f_2=\omega_2+\Delta\omega$ are simultaneously irradiated.

Incidentally, the cesium atom with magnetic quantum number m=+4 or −4 does not cause the EIT phenomenon since the ground level 1 does not exist.

Figure 6:
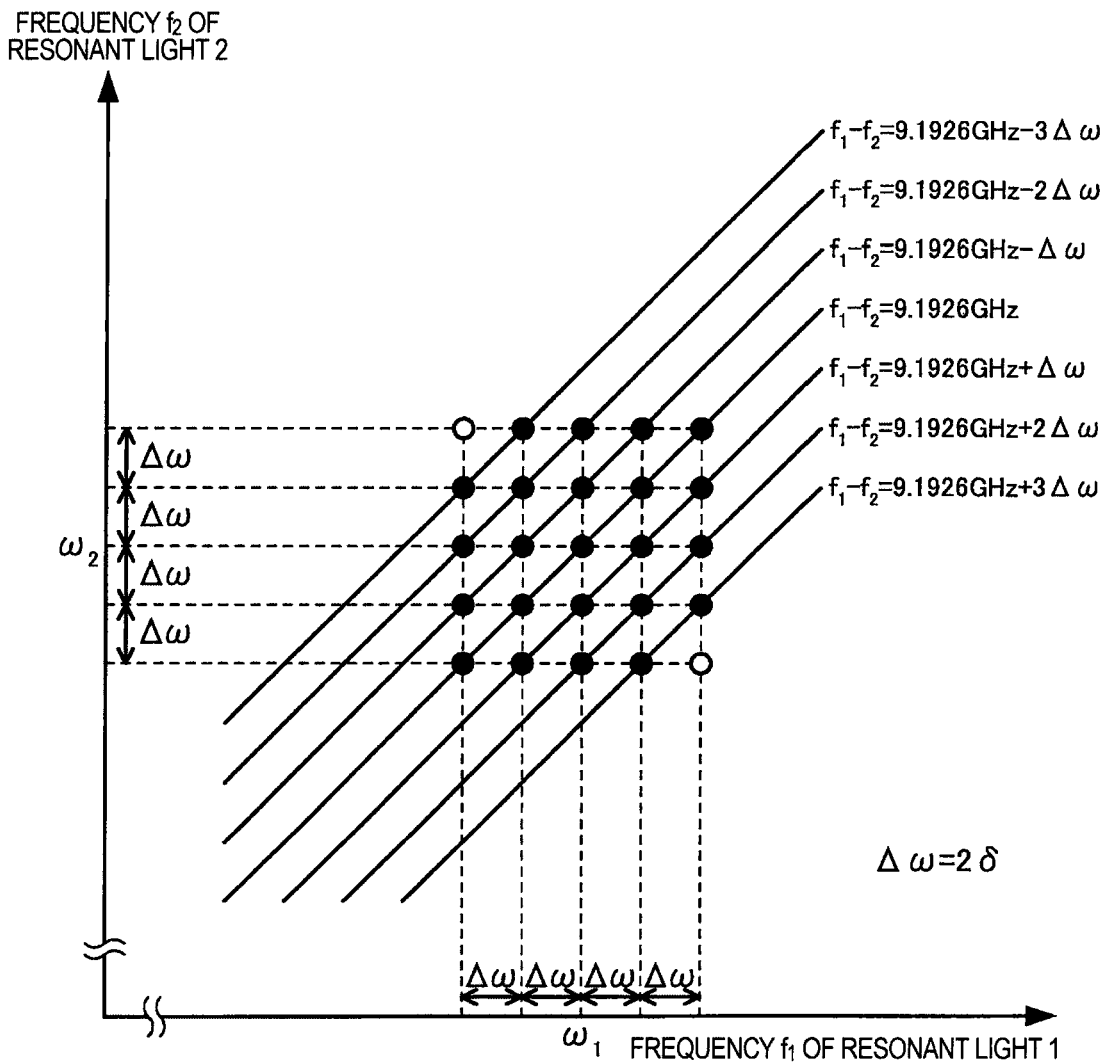
FIG. 6 is a view for explaining an example of a combination of two resonant lights in which the cesium atom causes the EIT phenomenon.

The combination of the resonant light 1 and the resonant light 2 described in FIG. 5 can be visually understood by using a graph shown in FIG. 6. In the graph of FIG. 6, the horizontal axis indicates the frequency $f_1$ of the resonant light 1, and the vertical axis indicates the frequency $f_2$ of the resonant light 2. It is indicated that the cesium atom in which the EIT phenomenon occurs exists in the combination of the frequency $f_1$ of the resonant light 1 and the frequency $f_2$ of the resonant light 2 in which the intersection point is indicated by a black dot, and the cesium atom in which the EIT phenomenon occurs does not exist in the combination of the frequency $f_1$ of the resonant light 1 and the frequency $f_2$ of the resonant light 2 in which the intersection point is indicated by a white dot. In more detail, the cesium atoms with magnetic quantum number m=−3, −2, −1, 0, +1, +2, +3 cause the EIT phenomenon in the combinations of the frequency $f_1$ of the resonant light 1 and the frequency $f_2$ of the resonant light 2 indicated by black dots on the respective straight lines of $f_1-f_2$=9.1926 GHz−3Δω, $f_1-f_2$=9.1926 GHz−2Δω, $f_1-f_2$=9.1926 GHz−Δω, $f_1-f_2$=9.1926 GHz, $f_1-f_2$=9.1926 GHz+Δω, $f_1-f_2$=9.1926 GHz+2Δω and $f_1-f_2$=9.1926 GHz+3Δω.

In the related art method, since only the resonant light 1 of $f_1=\omega_1$ and the resonant light 2 of $f_2=\omega_2$ are simultaneously irradiated, the cesium atom causes the EIT phenomenon only at the intersection point of $f_1=\omega_1$ and $f_2=\omega_2$ in FIG. 6. On the other hand, in this embodiment, the plural resonant lights 1 of $f_1=\omega_1-2\Delta\omega$, $\omega_1-\Delta\omega$, $\omega_1$, $\omega_1+\Delta\omega$ and $\omega_1+2\Delta\omega$ and the plural resonant light 2 of $f_2=\omega_2-2\Delta\omega$, $\omega_2-\Delta\omega$, $\omega_2$, $\omega_2+\Delta\omega$ and $\omega_2+2\Delta\omega$ are simultaneously irradiated, and at least the cesium atom with magnetic quantum number m=0 causes the EIT phenomenon (intersection points of $f_1-f_2$=9.1926 GHz). Further, when the feedback control is performed so as to satisfy Δω=2δ, the cesium atoms with magnetic quantum number m=−3, −2, −1, +1, +2, +3 also cause the EIT phenomenon.

As described above, according to the atomic oscillator 100 (the quantum interference device 1) of the embodiment, the control is performed so as to satisfy the relation of $\Delta\omega=2\delta$, so that the ratio of alkali metal atoms that cause the EIT phenomenon can be greatly increased as compared with the related art, and therefore, the power efficiency of the semiconductor laser 120 can be greatly improved as compared with the related art. Thus, miniaturization is also easy. For example, when power assigned to one resonant light pair is set to be almost equal to power of the related art, the saturation limit of light absorption becomes high, and the total power increases. Thus, a high contrast EIT signal can be acquired. Besides, when the total light irradiation power is almost equal to that of the related art, since the power per one resonant light pair is decreased, the power broadening of the EIT signal (phenomenon in which when the light power is high, the line width of the EIT signal is increased) can be suppressed, and as compared with the related art, an excellent EIT signal with narrow half-width can be acquired. Accordingly, according to the embodiment, the frequency stability can be improved as compared with the related art.

Although the intensity of the magnetic field applied to the atomic cell 130 is changed by the influence of geomagnetic field and the influence of temperature change, according to this embodiment, the feedback control is performed in view of also the influence of geomagnetic field and the influence of temperature change. Accordingly, the influence of disturbance is cancelled, and the higher accuracy atomic oscillator (quantum interference device) can be provided.

Figure 7:
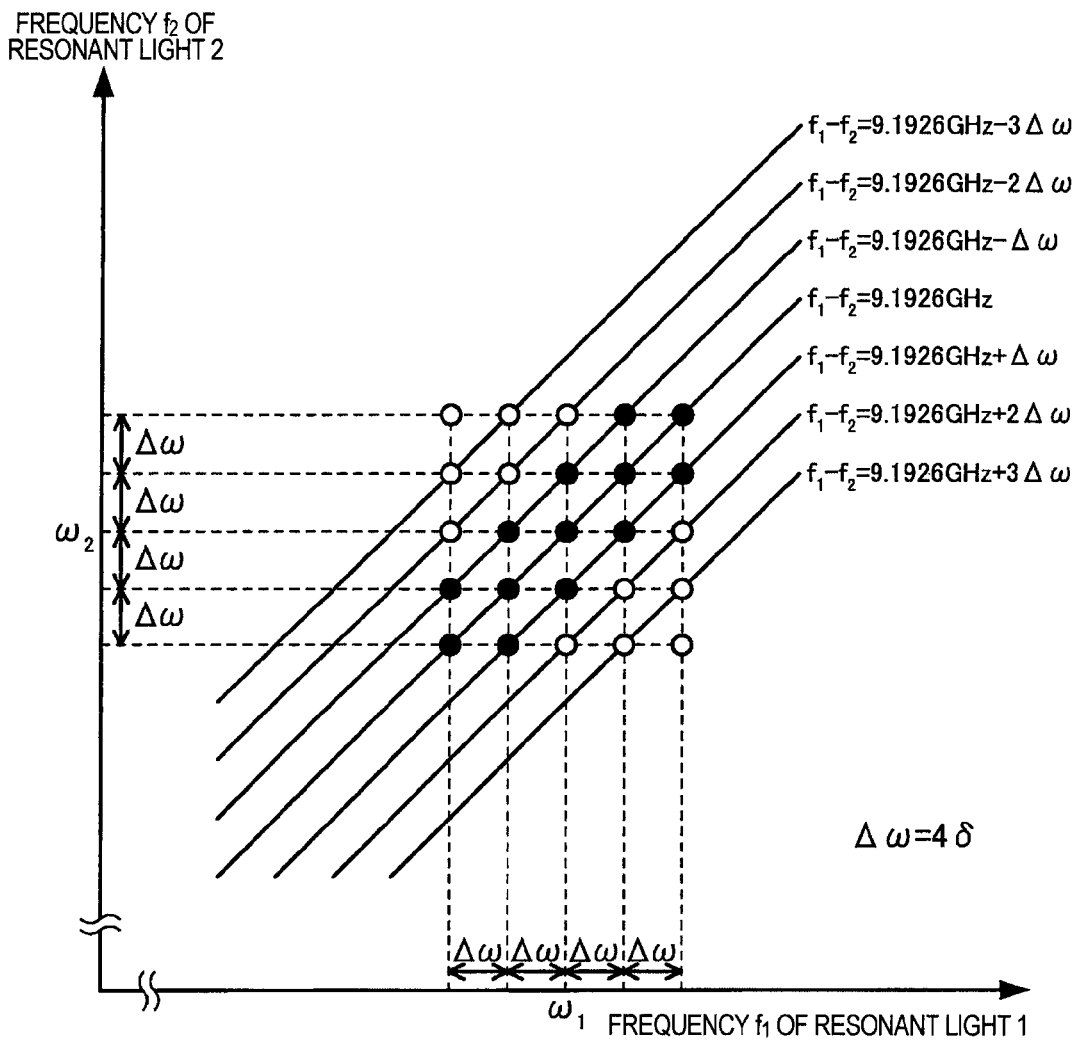
FIG. 7 is a view for explaining another example of a combination of two resonant lights in which the cesium atom causes the EIT phenomenon.
Figure 8:
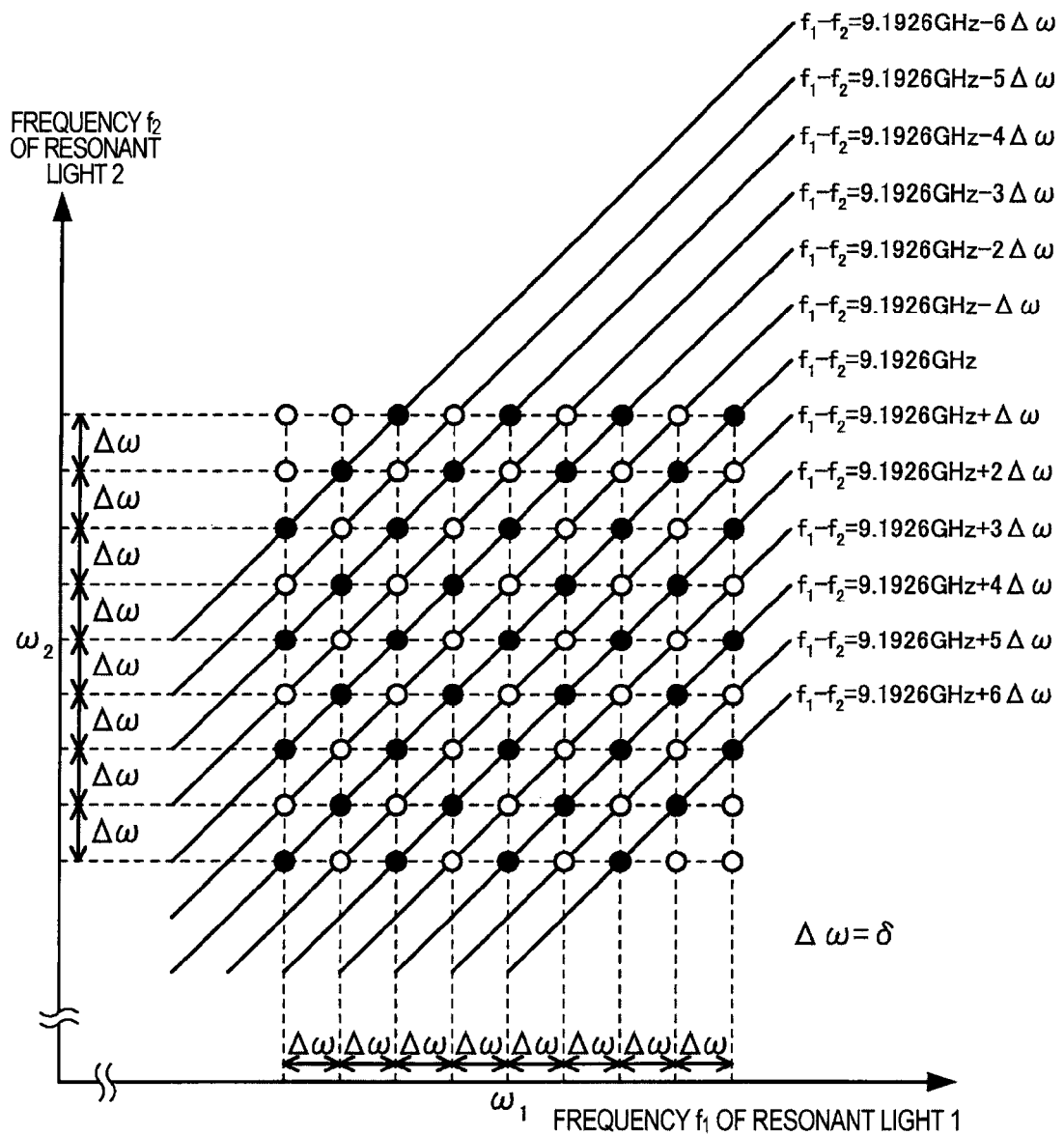
FIG. 8 is a view for explaining another example of a combination of two resonant lights in which the cesium atom causes the EIT phenomenon.

Incidentally, in this embodiment, in order to maximize the number of alkali metal atoms that cause the EIT phenomenon, it is preferable to establish the relation of $\Delta\omega=2\delta$. However, at least the relation of $2\times\delta\times n=\Delta\omega$ or $\Delta\omega\times n=2\times\delta$ (n is a positive integer) has only to be satisfied. For example, in the case of $\Delta\omega=4\delta$ (in the case of n=2 in $2\times\delta\times n=\Delta\omega$), as shown in FIG. 7, the cesium atoms with magnetic quantum number m=−2, 0, +2 cause the EIT phenomenon at intersection points on $f_1-f_2=9.1926$ GHz−$\Delta\omega$, $f_1-f_2=9.1926$ GHz and $f_1-f_2=9.1926$ GHz+$\Delta\omega$. Besides, for example, in the case of $\Delta\omega=\delta$ (in the case of n=2 in $\Delta\omega\times n=2\times\delta$), as shown in FIG. 8, the cesium atoms with magnetic quantum number m=−3, −2, −1, 0, +1, +2, +3 cause the EIT phenomenon at intersection points on $f_1-f_2=9.1926$ GHz−$6\Delta\omega$, $f_1-f_2=9.1926$ GHz−$4\Delta\omega$, $f_1-f_2=9.1926$ GHz−$2\Delta\omega$, $f_1-f_2=9.1926$ GHz, $f_1-f_2=9.1926$ GHz+$2\Delta\omega$, $f_1-f_2=9.1926$ GHz+$4\Delta\omega$, and $f_1-f_2=9.1926$ GHz+$6\Delta\omega$.

(2) Second Embodiment

Figure 9:
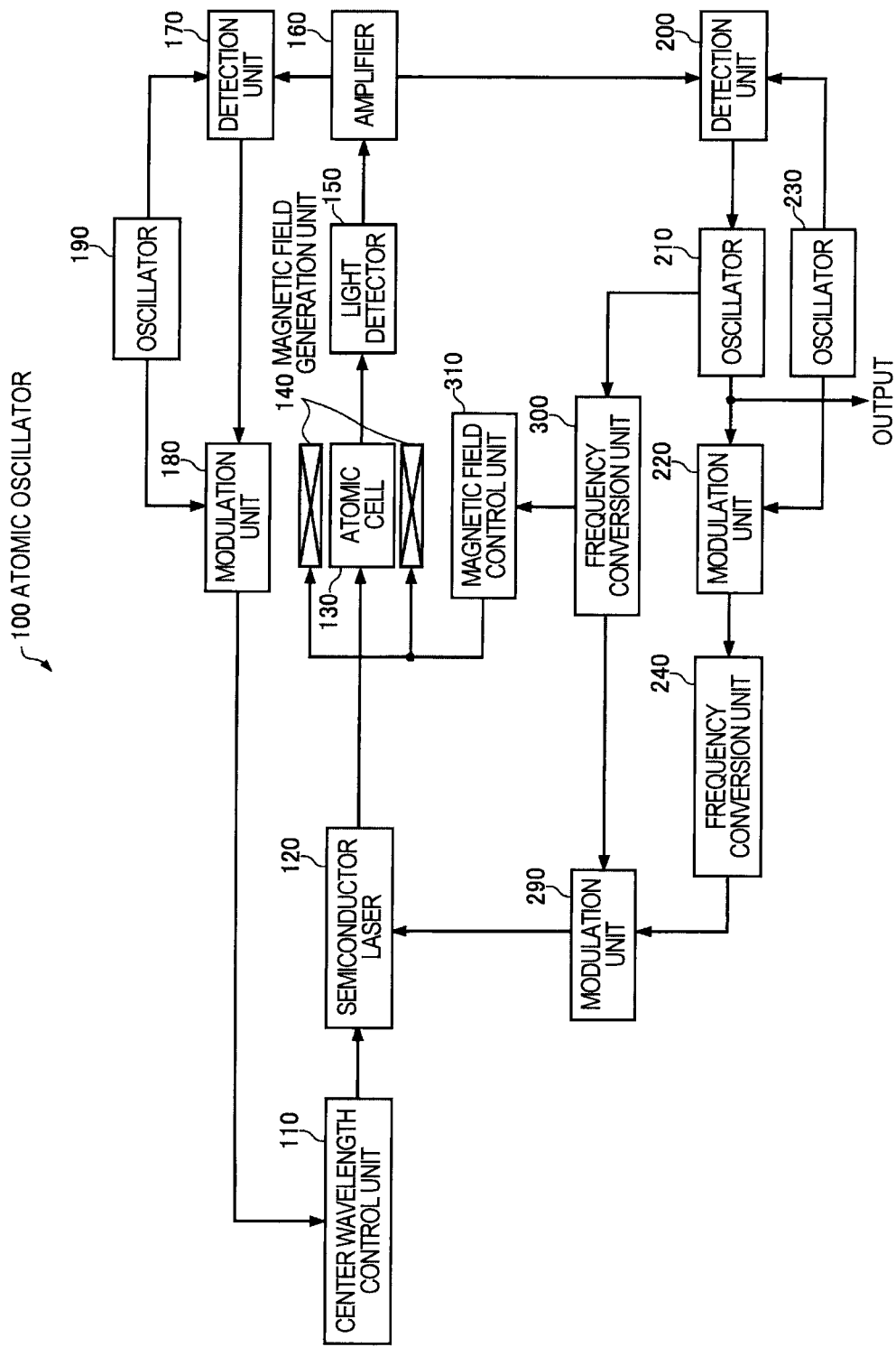
FIG. 9 is a view showing a structure of an atomic oscillator of a second embodiment.

FIG. 9 is a view showing a structure of an atomic oscillator of a second embodiment using the quantum interference device 1 of FIG. 1. As shown in FIG. 9, the atomic oscillator 100 of the second embodiment is different from the atomic oscillator 100 of the first embodiment shown in FIG. 2 in that the detection unit 250, the oscillator 260, the modulation unit 270 and the oscillator 280 are deleted and a frequency conversion unit 300 and a magnetic field control unit 310 are newly added. In FIG. 9, the same component as that of FIG. 2 is denoted by the same reference numeral and its description is omitted.

The frequency conversion unit 300 converts the oscillation signal of the oscillator 210 into a signal of a frequency $\Delta\omega$. The frequency conversion unit 300 may be realized by a divider circuit.

Here, in the atomic oscillator 100 of the second embodiment, the frequency $\Delta\omega$ of the output signal of the frequency conversion unit 300 has a constant value previously determined irrespective of the intensity of a magnetic field. The magnetic field control unit 310 controls the intensity of the magnetic field generated by a magnetic field generation unit 140 so as to satisfy the relation of at least $2\times\delta\times n=\Delta\omega$ or $\Delta\omega\times n=2\times\delta$ (n is a positive integer) ($\Delta\omega=2\delta$ is preferable).

Incidentally, a semiconductor laser 120, an atomic cell 130, the magnetic field generation unit 140, a light detector 150 and the magnetic field control unit 310 correspond to the light source 10, the atomic cell 20, the magnetic field generation unit 30, the light detection unit 40 and the magnetic field control unit 52 of FIG. 1, respectively. Besides, a circuit including a center wavelength control unit 110, an amplifier 160, a detection unit 170, a modulation unit 180, an oscillator 190, a detection unit 200, the oscillator 210, a modulation unit 220, an oscillator 230, a frequency conversion unit 240, a modulation unit 290, the frequency conversion unit 300 and the magnetic field control unit 310 corresponds to the control unit 50 of FIG. 1.

According to the second embodiment, the magnetic field control unit 310 controls the intensity of the magnetic field generated by the magnetic field generation unit 140 in view of also the influence of geomagnetic field and the influence of temperature change. Accordingly, the influence of disturbance is cancelled, and the higher accuracy atomic oscillator (quantum interference device) can be provided.

Modified Example

Figure 10:
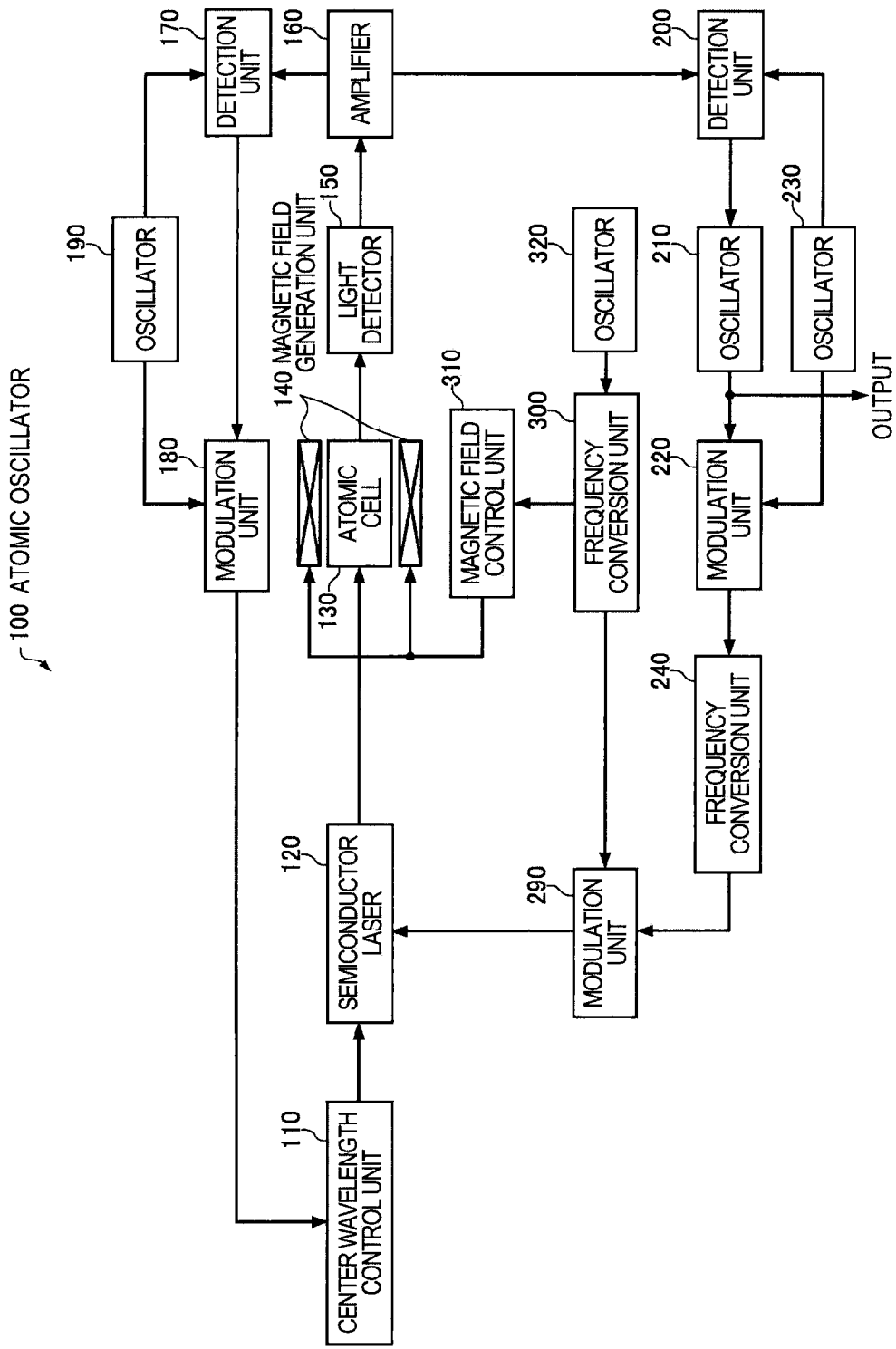
FIG. 10 is a view showing a structure of a modified example of the atomic oscillator of the second embodiment.

FIG. 10 is a view showing a structure of a modified example of the atomic oscillator 100 of the second embodiment. In the atomic oscillator 100 shown in FIG. 10, an oscillator 320 is newly added to the atomic oscillator 100 shown in FIG. 9. A frequency conversion unit 300 converts the oscillation signal of the oscillator 320 into a signal of a frequency $\Delta\omega$. Here, although the frequency stability of the oscillator 320 is inferior to the oscillator 210 of FIG. 9, the accuracy of $\Delta\omega$ has only to be secured to such a degree that alkali metal atoms enclosed in a atomic cell 130 can sufficiently cause the EIT phenomenon. The oscillator 320 can be realized by, for example, a crystal oscillator (XO).

Incidentally, in the atomic oscillator 100 shown in FIG. 9 or FIG. 10, when $\Delta\omega$ is made coincident with the oscillation frequency of the oscillator 210 or the oscillator 320, the oscillator conversion unit 300 is unnecessary. In this case, the magnetic field control unit 310 controls the intensity of the magnetic field generated by the magnetic field generation unit 140 based on the oscillation signal of the oscillator 210 or the oscillator 320.

(3) Third Embodiment

Figure 11:
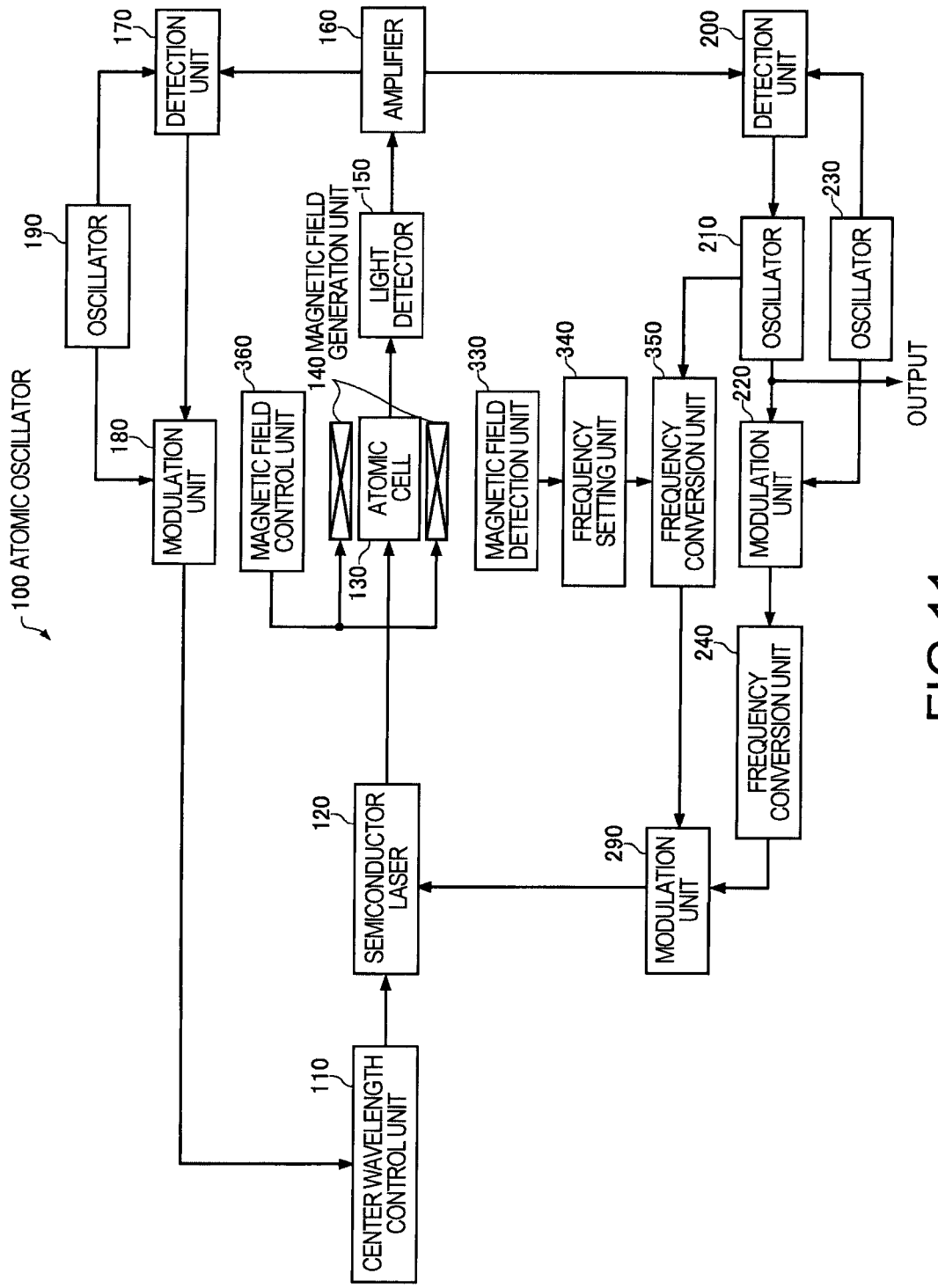
FIG. 11 is a view showing a structure of an atomic oscillator of a third embodiment.

FIG. 11 is a view showing a structure of an atomic oscillator of a third embodiment using the quantum interference device 1 of FIG. 1. As shown in FIG. 11, the atomic oscillator 100 of the third embodiment is different from the atomic oscillator 100 of the first embodiment shown in FIG. 2 in that the detection unit 250, the oscillator 260, the modulation unit 270 and the oscillator 280 are deleted, and a magnetic field detection unit 330, a frequency setting unit 340, a frequency conversion unit 350 and a magnetic field control unit 360 are newly added. In FIG. 11, the same component as that of FIG. 2 is denoted by the same reference numeral and its description is omitted.

The magnetic field control unit 360 controls so that the magnetic field generation unit 140 generates a magnetic field of desired intensity. For example, when a magnetic field generation unit 140 is a coil, the magnetic field control unit 360 controls the magnitude of a current flowing though the coil.

The magnetic field detection unit 330 detects the intensity of a magnetic field applied to an atomic cell 130.

The frequency setting unit 340 controls the frequency conversion ratio of the frequency conversion unit 350 based on the detection result of the magnetic field detection unit 330.

The frequency conversion unit 350 converts an oscillation signal of an oscillator 210 into a signal of a frequency $\Delta\omega$ based on an output signal (setting information of a frequency conversion ratio) of the frequency setting unit 340. The frequency conversion unit 350 may be realized by a divider circuit. In this case, the frequency setting unit 340 sets the division ratio of the divider circuit.

Here, the frequency setting unit 340 controls the frequency conversion ratio (for example, the division ratio) of the frequency conversion unit 350 so as to satisfy the relation of at least $2\times\delta\times n=\Delta\omega$ or $\Delta\omega\times n=2\times\delta$ (n is a positive integer) ($\Delta\omega=2\delta$ is preferable) based on the intensity of the magnetic field detected by the magnetic field detection unit 330.

Incidentally, a semiconductor laser 120, the atomic cell 130, the magnetic field generation unit 140, a light detector 150 and the magnetic field detection unit 330 correspond to the light source 10, the atomic cell 20, the magnetic field generation unit 30, the light detection unit 40 and the magnetic field detection unit 54 of FIG. 1, respectively. Besides, a circuit including a center wavelength control unit 110, an amplifier 160, a detection unit 170, a modulation unit 180, an oscillator 190, a detection unit 200, the oscillator 210, a modulation unit 220, an oscillator 230, a frequency conversion unit 240, a modulation unit 290, the magnetic field detection unit 330, the frequency setting unit 340, the frequency conversion unit 350 and the magnetic field control unit 360 corresponds to the control unit 50 of FIG. 1.

According to the third embodiment, the intensity of the magnetic field applied to the alkali metal atoms enclosed in the atomic cell 130 is detected by the magnetic field detection unit 330 in view of also the influence of geomagnetic field and the influence of temperature change. Then, the frequency conversion ratio of the frequency conversion unit 350 is controlled by the frequency setting unit 340 based on the intensity of the detected magnetic field. Accordingly, the influence of disturbance is cancelled, and the higher accuracy atomic oscillator (quantum interference device) can be provided.

Modified Example

Figure 12:
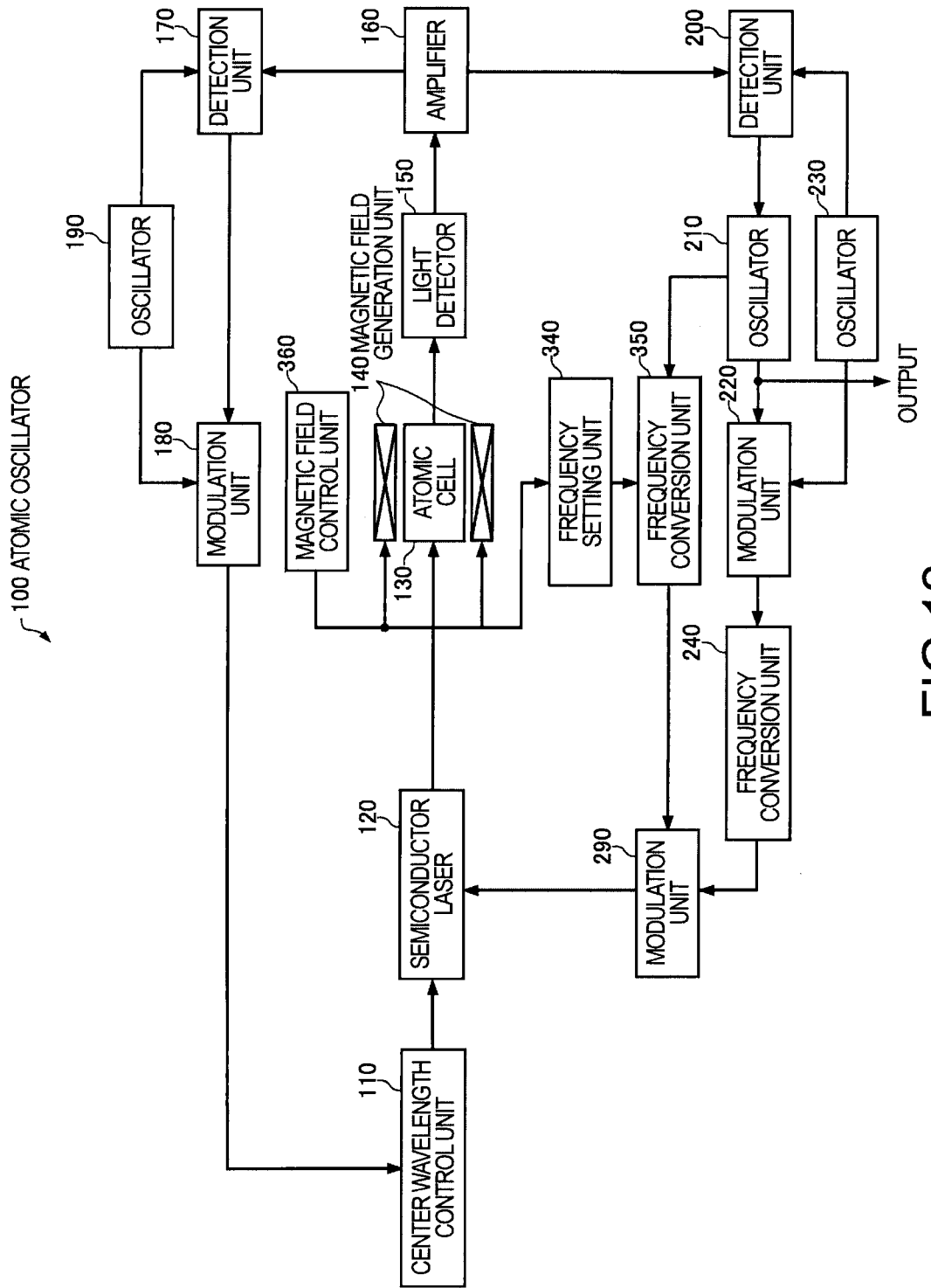
FIG. 12 is a view showing a structure of a modified example of the atomic oscillator of the third embodiment.

FIG. 12 is a view showing a structure of a modified example of the atomic oscillator 100 of the third embodiment. In an atomic oscillator 100 shown in FIG. 12, the magnetic field detection unit 330 is deleted from the atomic oscillator 100 shown in FIG. 11. Then, a frequency setting unit 340 controls a frequency conversion ratio of a frequency conversion unit 350 based on control information of a magnetic field control unit 360 to a magnetic field generation unit 140. That is, in the atomic oscillator 100 of FIG. 12, the intensity of a magnetic field is estimated based on the control information to the magnetic field generation unit 140, and the conversion ratio of the frequency conversion unit 350 is controlled. Accordingly, although the frequency accuracy of the output signal of the frequency conversion unit 350 is inferior to the oscillator 210 of FIG. 11, the accuracy of $\Delta\omega$ has only to be secured to such a degree that alkali metal atoms enclosed in an atomic cell 130 can sufficiently cause the EIT phenomenon. For example, when the environment is such that the influence of geomagnetic field or the influence of temperature change is neglected, there is no problem.

3. Magnetic Sensor (1) First Embodiment

Figure 13:
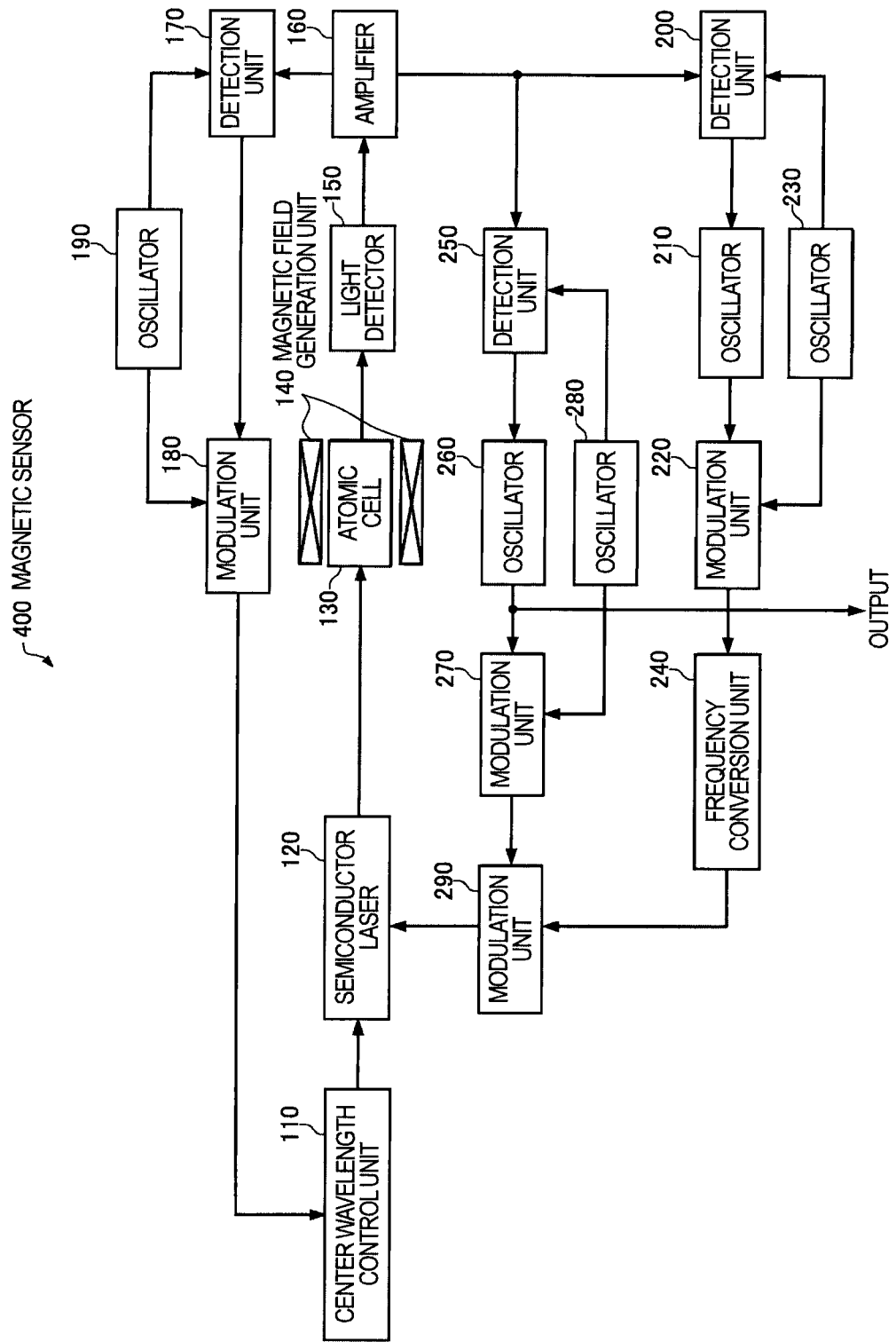
FIG. 13 is a view showing a structure of a magnetic sensor of a first embodiment.

FIG. 13 is a view showing a structure of a magnetic sensor of a first embodiment using the quantum interference device 1 of FIG. 1. As shown in FIG. 13, the magnetic sensor 400 of the first embodiment has the same structure as that of the atomic oscillator 100 of the first embodiment shown in FIG. 2 except that an oscillation signal of an oscillator 260 becomes an output signal. In FIG. 13, the same component as that of FIG. 2 is denoted by the same reference numeral and its description is omitted.

As described before, when magnetic field is applied to an atomic cell 130, the ground level 1 and the ground level 2 of an alkali metal atom are divided into plural Zeeman split levels different from each other in magnetic quantum number m. In both the ground level 1 and the ground level 2, an energy difference $E_\delta$ between two Zeeman split levels different in magnetic quantum number m by one is proportional to the intensity of the magnetic field. According to the structure of FIG. 13, feedback control is performed so that the signal intensity of an output signal of a light detector 150 (output signal of an amplifier 160) becomes maximum. The signal intensity of the output signal of the light detector 150 (the output signal of the amplifier 160) becomes maximum when the relation of $2\times\delta\times n=\Delta\omega$ or $\Delta\omega\times n=2\times\delta$ (n is a positive integer) ($\Delta\omega=2\delta$ is preferable) is satisfied with respect to an oscillation frequency $\Delta\omega$ of the oscillator 260 and a frequency $\delta$ corresponding to the energy difference $E_\delta$ between the Zeeman split levels. That is, since the oscillation frequency $\Delta\omega$ of the oscillator 260 is proportional to the intensity of the magnetic field, when the oscillation signal of the oscillator 260 is made the output signal, the function as the magnetic sensor can be exerted. In the structure of FIG. 13, although the magnetic field is always generated by a magnetic generation unit 140, the intensity of an external magnetic field can be calculated by obtaining the relative frequency of the output signal based on the oscillation frequency of the oscillator 260 when the intensity of the external magnetic field is 0.

(2) Second Embodiment

Figure 14:
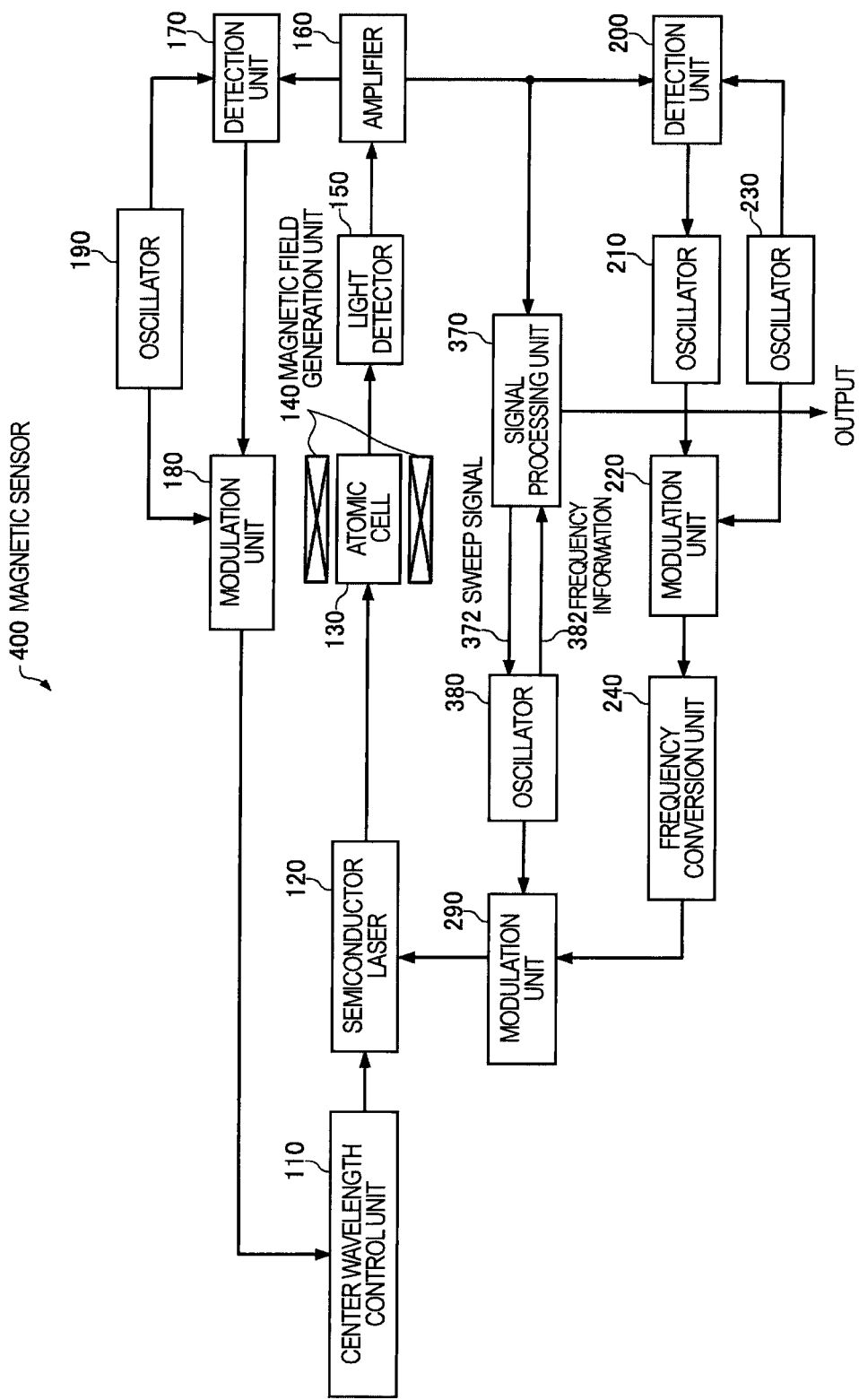
FIG. 14 is a view showing a structure of a magnetic sensor of a second embodiment.
Figure 15:
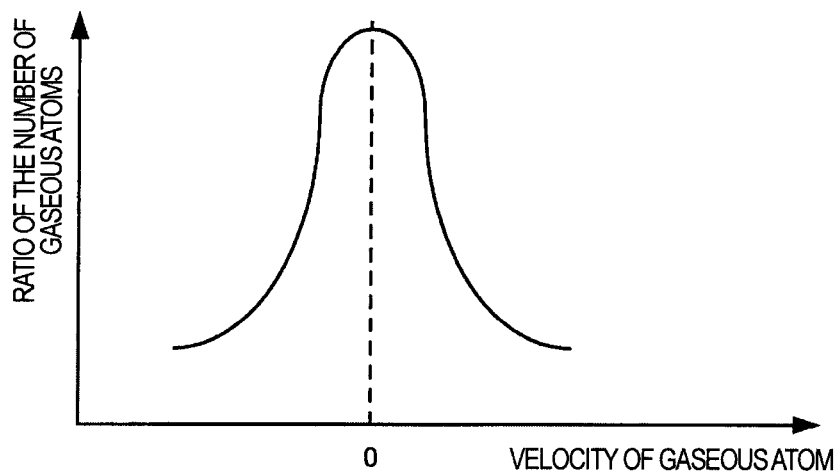
FIG. 15 is a schematic view of a velocity distribution of a gaseous alkali metal atom group.
Figure 16:
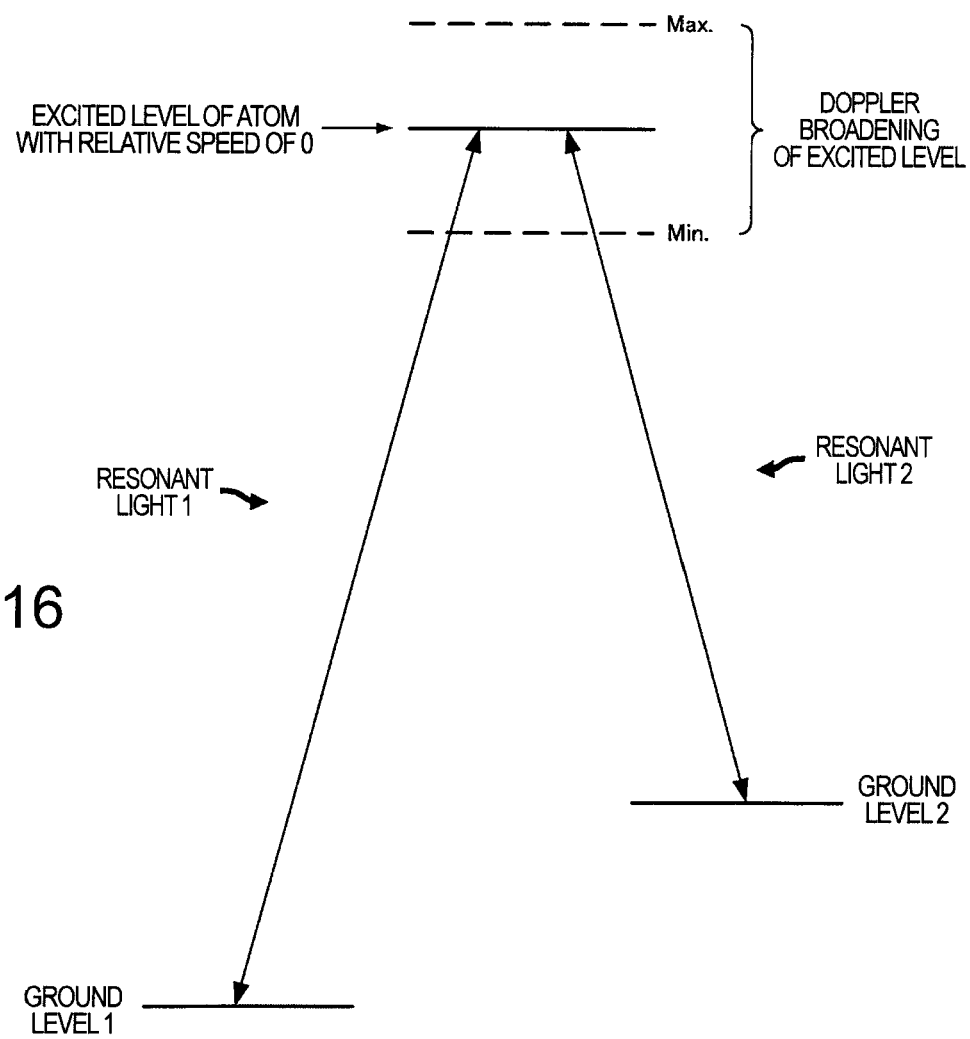
FIG. 16 is a view schematically showing an energy level in view of a Doppler effect by the motion of an alkali metal atom.

FIG. 14 is a view showing a structure of a magnetic sensor of a second embodiment using the quantum interference device 1 of FIG. 1. As shown in FIG. 14, the magnetic sensor 400 of the second embodiment is different from the magnetic sensor 400 of the first embodiment shown in FIG. 13 in that the detection unit 250, the oscillator 260, the modulation unit 270 and the oscillator 280 are deleted, and a signal processing unit 370 and an oscillator 380 are newly added. In FIG. 14, the same component as that of FIG. 13 is denoted by the same reference numeral and its description is omitted.

The signal processing unit 370 sends a sweep signal 372 for changing an oscillation frequency stepwise to the oscillator 380, and monitors an output signal of an amplifier 160 in each state of the sweep signal 372 and frequency information 382 (which may be the oscillation signal itself) of the oscillator 380. In the magnetic sensor 400 of the second embodiment, the oscillation frequency of the oscillator 380 is $\Delta\omega$, and when the relation of $2\times\delta\times n=\Delta\omega$ or $\Delta\omega\times n=2\times\delta$ (n is a positive integer) ($\Delta\omega=2\delta$ is preferable) is satisfied, the signal intensity of the output signal of the amplifier 160 abruptly increases. Since the frequency information 382 is proportional to the intensity of magnetic field, when information (information indicating the intensity of magnetic field) based on the frequency information 382 when the signal intensity of the output signal of the amplifier 160 abruptly increases is outputted, the function as the magnetic sensor can be exerted. Although magnetic field is always generated by a magnetic field generation unit 140 in the structure of FIG. 14, information indicating the intensity of the external magnetic field can be outputted by obtaining the relative frequency of the oscillator 380 based on the frequency information 382 when the intensity of the external magnetic field is 0.

Incidentally, when the signal processing unit 370 can estimate the oscillation frequency of the oscillator 380 from the state of the sweep signal 372, the frequency information 382 may not be monitored.

According to the first embodiment and the second embodiment, the use efficiency of laser power is improved by raising the occurrence efficiency of the EIT phenomenon in the alkali metal atom, and the high sensitivity magnetic sensor can be provided. Thus, the miniaturization is also easy.

Incidentally, the invention is not limited to the embodiments, but can be variously modified within the scope of the gist of the invention.

For example, in the atomic oscillator 100 of the embodiment, although the AC current is superimposed on the drive current of the semiconductor laser 120, and the semiconductor laser 120 emits the modulated light, an electro-optic modulator (EOM) is used, and frequency modulation may be applied to the light emitted from the semiconductor laser 120.

The invention includes substantially the same structure as the structure described in the embodiments (for example, the structure having the same function, method and result, or the structure having the same object and effect). Besides, the invention includes a structure in which an unessential portion of the structure described in the embodiments is replaced. Besides, the invention includes a structure which can achieve the same operation and effect as the structure described in the embodiments or the structure which can achieve the same object. Besides, the invention includes a structure in which a well-known technique is added to the structure described in the embodiments.

What is claimed is:

1. A quantum interference device comprising:
    an alkali metal atom that has a plurality of Λ-type 3-level system energy levels; and
    a light source that emits a plurality of pairs of resonant light to the alkali metal atom, wherein
    each of the plurality of Λ-type 3-level system energy levels having a pair of ground levels and an excited level, and each of the pair of ground levels and each of the excited level among the plurality of Λ-type 3-level system energy levels being respectively different from each other,
    each of the plurality of pairs of resonant light having a frequency difference, the frequency difference being different from each other among the plurality of pairs of resonant light in accordance with each of the plurality of Λ-type 3-level system energy levels, and
    wherein an electromagnetically induced transparency phenomenon occurs in the alkali metal atom by each of the plurality of pairs of resonant light in accordance with each of the plurality of Λ-type 3-level system energy levels.

2. The quantum interference device according to claim 1, wherein
    the light source emits the plurality of pairs of resonant light to the alkali metal atom in accordance with each of the plurality of Λ-type 3-level system energy levels, and
    wherein center frequencies of the plurality of pairs of resonant light are different from each other.

3. The quantum interference device according to claim 2, further comprising:
    a magnetic field generator that generates the plurality of Λ-type 3-level system energy levels by providing a magnetic field of a predetermined intensity to the alkali metal atom.

4. The quantum interference device according to claim 3, wherein
    the light source emits light including the plurality of pairs of resonant light,
    the plurality of pairs of resonant light include a plurality of first resonant lights different from each other in frequency by a first predetermined frequency difference and a plurality of second resonant lights different from each other in frequency by a second predetermined frequency difference, and
    a first frequency of each of the first resonant lights is different from a second frequency of each of the second resonant lights.

5. The quantum interference device according to claim 4, further comprises
    a control unit that controls the first and second predetermined frequency differences based on an intensity of the magnetic field near the alkali metal atom.

6. The quantum interference device according to claim 4, further comprises
    a magnetic field control unit that controls the intensity of the magnetic field generated by the magnetic field generator according to the first and second predetermined frequency differences.

7. The quantum interference device according to claim 4, further comprises
    a light detection unit that detects the first resonant lights and the second resonant lights passing through the alkali metal atom, wherein
    the first and second predetermined frequency differences are controlled by a detection result of the light detection unit.

8. The quantum interference device according to claim 1, further comprises
    a magnetic field generator that generates the plurality of Λ-type 3-level system energy levels by providing a magnetic field of a predetermined intensity to the alkali metal atom.

9. The quantum interference device according to claim 8, wherein
    the light source emits light including the plurality of pairs of resonant light,
    the plurality of pairs of resonant light include a plurality of first resonant lights different from each other in frequency by a first predetermined frequency difference and a plurality of second resonant lights different from each other in frequency by a second predetermined frequency difference, and
    a first frequency of each of the first resonant lights are different from a second frequency of each of the second resonant lights.

10. The quantum interference device according to claim 9, further comprises
    a control unit that controls the first and second predetermined frequency differences based on an intensity of the magnetic field near the alkali metal atom.

11. The quantum interference device according to claim 9, further comprises
   a magnetic field control unit that controls the intensity of the magnetic field generated by the magnetic field generator according to the first and second predetermined frequency differences.

12. The quantum interference device according to claim 9, further comprises
   a light detection unit that detects the first resonant lights and the second resonant lights passing through the alkali metal atom, wherein
   the first and second predetermined frequency differences are controlled by a detection result of the light detection unit.

13. An atomic oscillator comprising a quantum interference device as recited in claim 1.

14. An atomic oscillator comprising a quantum interference device as recited in claim 2.

15. A magnetic sensor comprising a quantum interference device as recited in claim 1.

16. A magnetic sensor comprising a quantum interference device as recited in claim 2.

* * * * *